United States Patent
Aal

(10) Patent No.: US 12,376,265 B2
(45) Date of Patent: Jul. 29, 2025

(54) VEHICLE, A MAIN FRAME, A MODULE POCKET, AN ELECTRONIC MODULE, AND A PRINTED CIRCUIT BOARD

(71) Applicant: Volkswagen Aktiengesellschaft, Wolfsburg (DE)

(72) Inventor: Andreas Aal, Braunschweig (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 360 days.

(21) Appl. No.: 17/916,749

(22) PCT Filed: Mar. 24, 2021

(86) PCT No.: PCT/EP2021/057651
§ 371 (c)(1),
(2) Date: Oct. 3, 2022

(87) PCT Pub. No.: WO2021/197982
PCT Pub. Date: Oct. 7, 2021

(65) Prior Publication Data
US 2023/0156901 A1 May 18, 2023

(30) Foreign Application Priority Data

Apr. 3, 2020 (DE) .......................... 102020204378.7
Jun. 29, 2020 (DE) .......................... 102020208053.4
Nov. 24, 2020 (DE) .......................... 102020214744.2

(51) Int. Cl.
*H05K 7/20* (2006.01)
*H05K 1/02* (2006.01)
*H05K 1/18* (2006.01)

(52) U.S. Cl.
CPC ....... *H05K 7/20454* (2013.01); *H05K 1/0207* (2013.01); *H05K 1/181* (2013.01);
(Continued)

(58) Field of Classification Search
CPC .................................................. H05K 7/20454
(Continued)

(56) References Cited

U.S. PATENT DOCUMENTS 5,740,018 A * 4/1998 Rumbut, Jr. ....... H05K 7/20636
361/720
6,246,159 B1 * 6/2001 Dejugnac ............. H10N 30/802
310/358

(Continued)

FOREIGN PATENT DOCUMENTS

CN 106058952 A 10/2016
DE 19506664 A1 2/1996
(Continued)

OTHER PUBLICATIONS

PCT/EP2021/057651 International Search Report (Jul. 9, 2021).
DE102020208053.4. Examination Report (Feb. 24, 2021).

*Primary Examiner* — Stanley Tso
(74) *Attorney, Agent, or Firm* — Peter Zura; LOZA & LOZA, LLP

(57) ABSTRACT

A central compute unit, configured as a vehicle central compute unit, to a pocket module, to an electronic module, and to a printed circuit board, to a cooling blade, and to a main frame. The printed circuit board for an electronic vehicular component includes a thermal distribution layer in the printed circuit board and one or more thermal coupling areas on the surface of the printed circuit board. The one or more thermal coupling areas are configured for heat dissipation away from the printed circuit board, and the one or more thermal coupling areas are thermally coupled to the thermal distribution layer in the printed circuit board.

20 Claims, 26 Drawing Sheets

(52) U.S. Cl.
CPC ......... *H05K 1/185* (2013.01); *H05K 7/20854* (2013.01); *H05K 7/20872* (2013.01); *H05K 2201/10151* (2013.01)

(58) Field of Classification Search
USPC ........................................................ 174/15.1
See application file for complete search history.

(56) References Cited

U.S. PATENT DOCUMENTS

| | | | |
|---|---|---|---|
| 7,312,987 B1 | 12/2007 | Konshak | |
| 8,134,446 B2* | 3/2012 | Kloiber | H05K 3/321 |
| | | | 338/28 |
| 9,320,182 B2 | 4/2016 | Steger et al. | |
| 9,326,431 B2 | 4/2016 | Matsushita et al. | |
| 10,314,207 B1 | 6/2019 | Skalski et al. | |
| 10,455,697 B2 | 10/2019 | Kim | |
| 10,575,448 B1* | 2/2020 | Lewis | H05K 9/0081 |
| 2002/0047193 A1* | 4/2002 | Dorfler | H01L 23/3677 |
| | | | 257/E23.105 |
| 2008/0302505 A1 | 12/2008 | Kato et al. | |
| 2009/0159241 A1 | 6/2009 | Lipp et al. | |
| 2010/0200277 A1* | 8/2010 | Huang | H05K 1/0204 |
| | | | 29/829 |
| 2013/0128460 A1 | 5/2013 | Rossi et al. | |
| 2014/0233175 A1 | 8/2014 | Demange et al. | |
| 2015/0034271 A1 | 2/2015 | Jin et al. | |
| 2016/0240985 A1* | 8/2016 | Chang | H01R 25/00 |
| 2016/0309623 A1 | 10/2016 | Lei et al. | |
| 2018/0070481 A1 | 3/2018 | Lei et al. | |
| 2019/0098800 A1 | 3/2019 | Jia et al. | |
| 2019/0166691 A1 | 5/2019 | Kim | |
| 2019/0223324 A1 | 7/2019 | Le et al. | |
| 2020/0029469 A1 | 1/2020 | McCordic et al. | |
| 2020/0153233 A1* | 5/2020 | Michna | H02H 5/043 |
| 2021/0197733 A1* | 7/2021 | Percival | G03B 17/02 |

FOREIGN PATENT DOCUMENTS

| | | | | |
|---|---|---|---|---|
| DE | 102005048492 B4 | | 4/2007 | |
| DE | 102006031344 A1 | | 1/2008 | |
| DE | 102010030525 A1 | | 12/2011 | |
| KR | 100757607 B1 | | 9/2007 | |
| WO | 2002035898 A1 | | 5/2002 | |
| WO | WO-2011160879 A1 | * | 12/2011 | ......... F16H 61/0006 |
| WO | 2015158261 A1 | | 10/2015 | |

\* cited by examiner

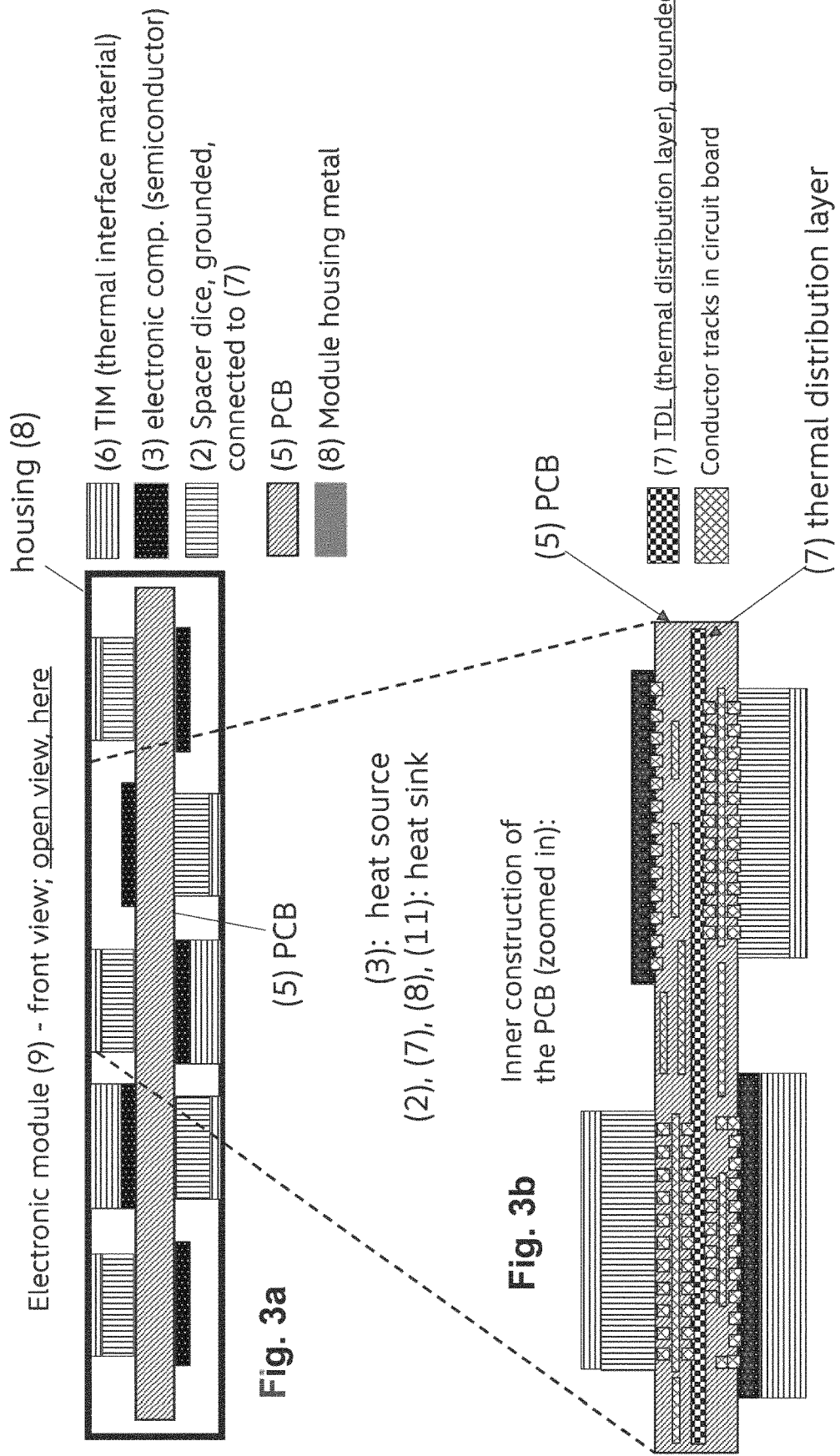

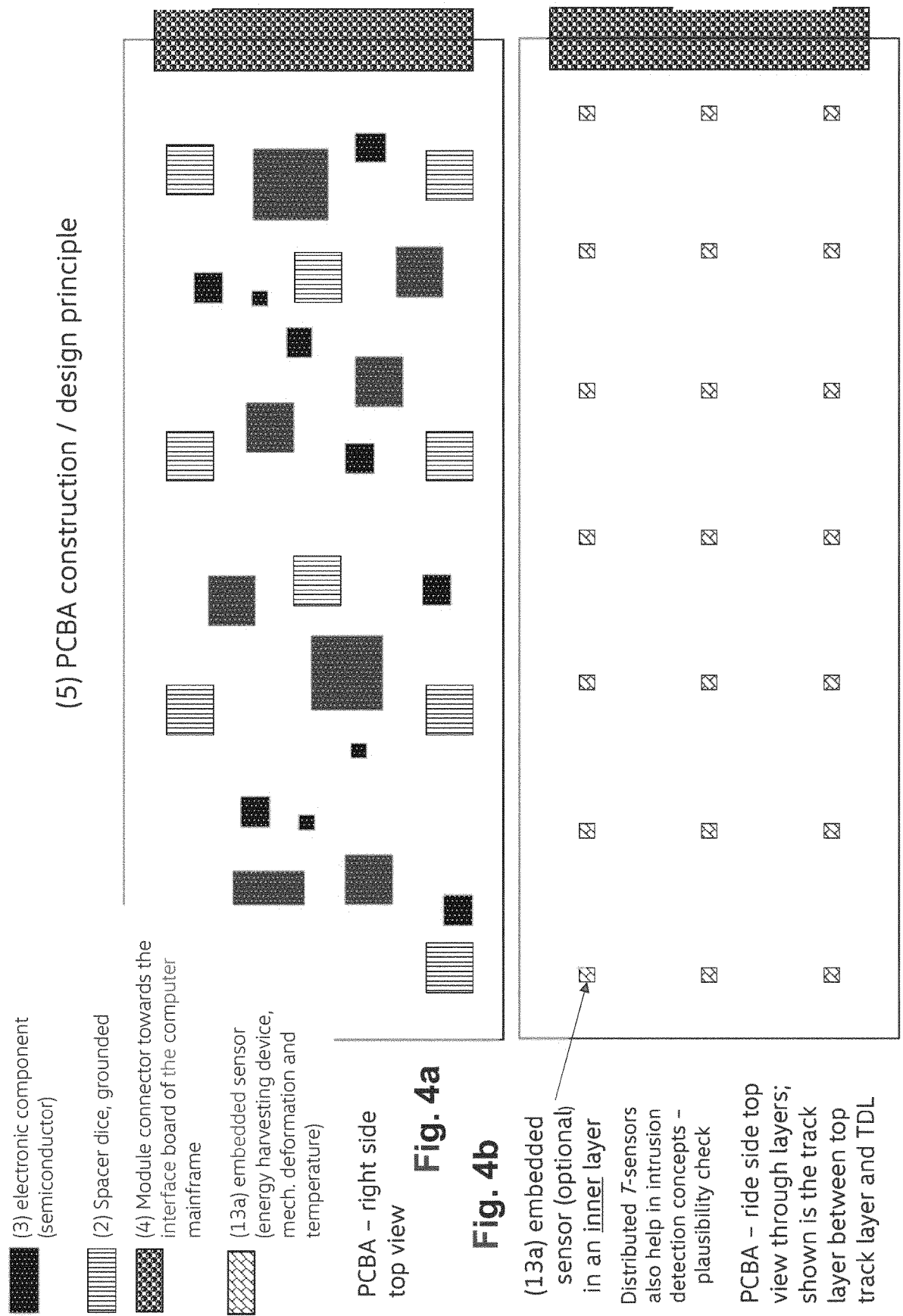

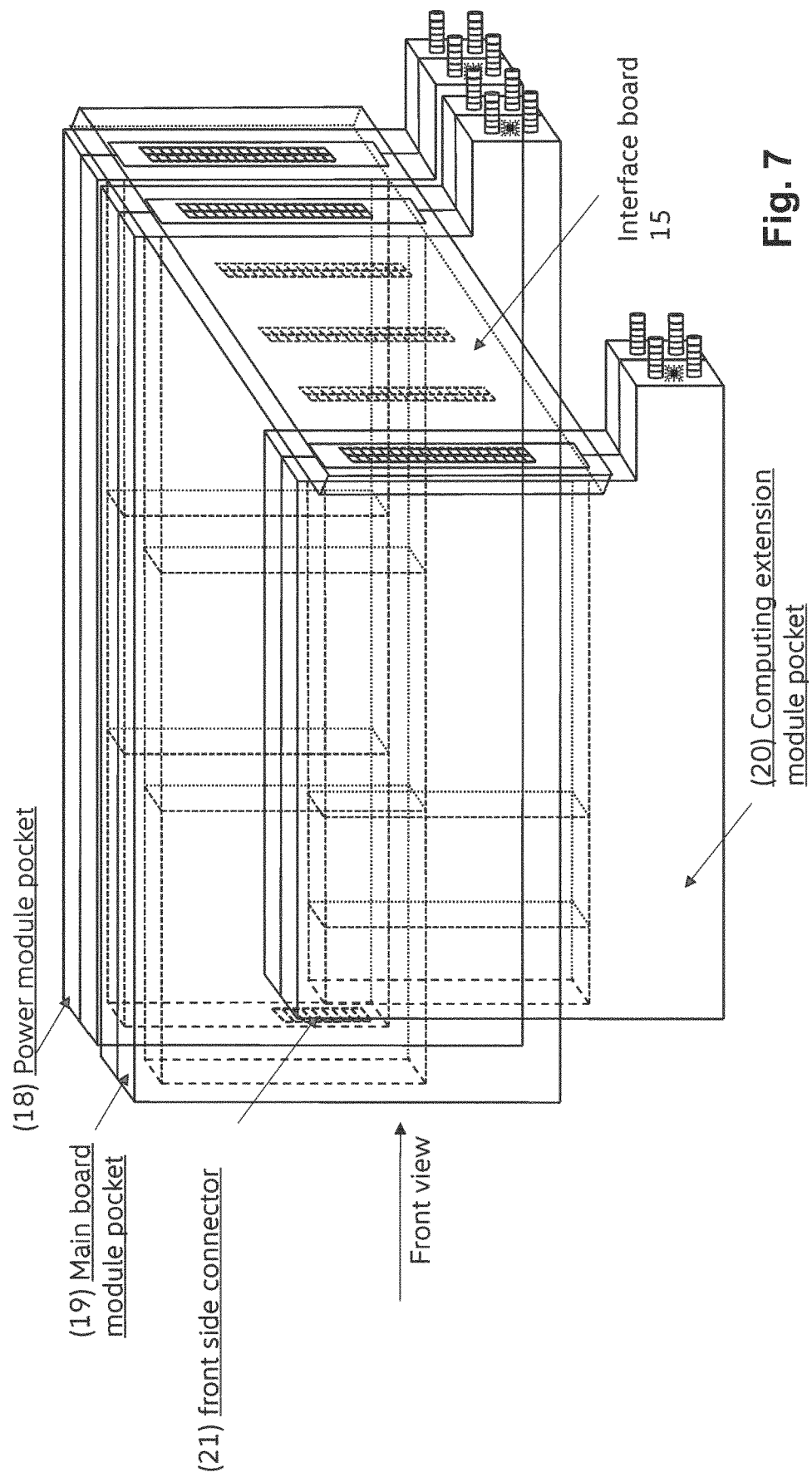

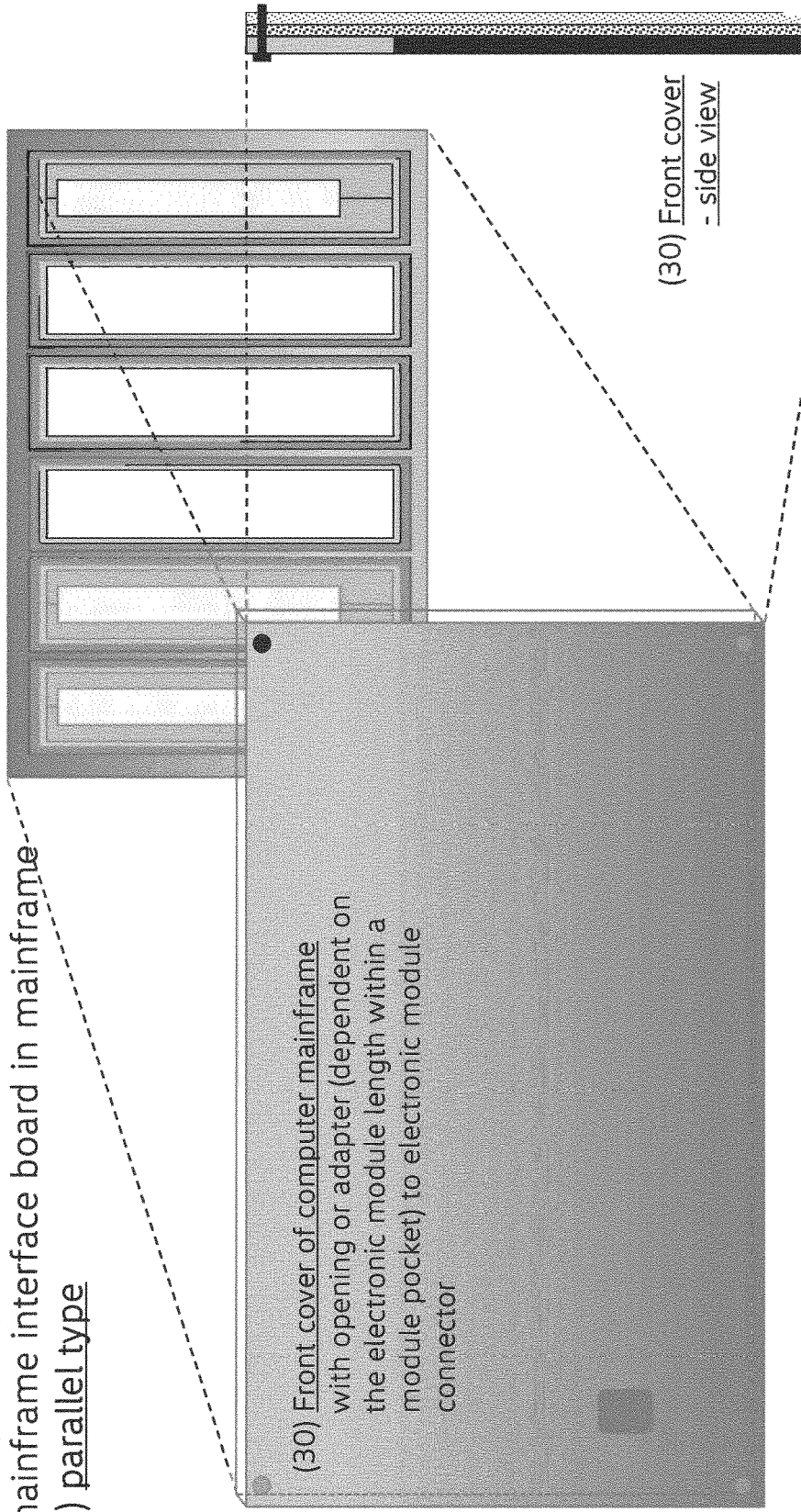

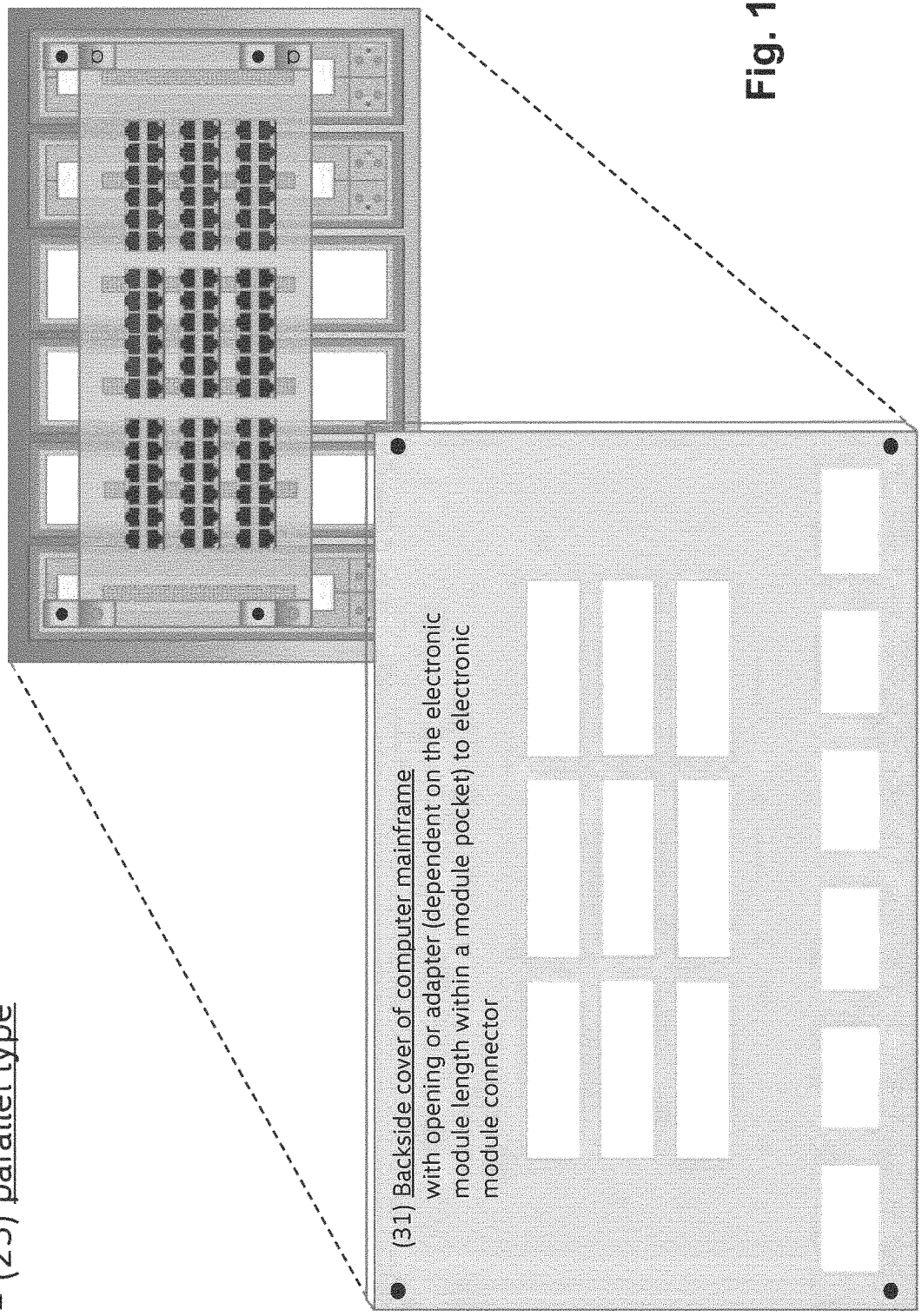

(31) Backside cover of computer mainframe – (25) parallel type

(31) Backside cover - side view

(27) Vibration and shock isolation through elastomeric damping sheets – could also enclose air bubble based damping elements

(28) electrically-conductive silicone elastomers that provide shielding against electromagnetic interference (EMI) and radio frequency interference (RFI).

Exemplary configuration of three modules enclosed between cooling blades connected to the mainframe interface board without (31) backside cover & transparent (15) interface board – (25) parallel type – backside view

(16) Shock / vibration damping element

(15) Interface board

(17) Connectors to communication network (Ethernet as an exemplary here)

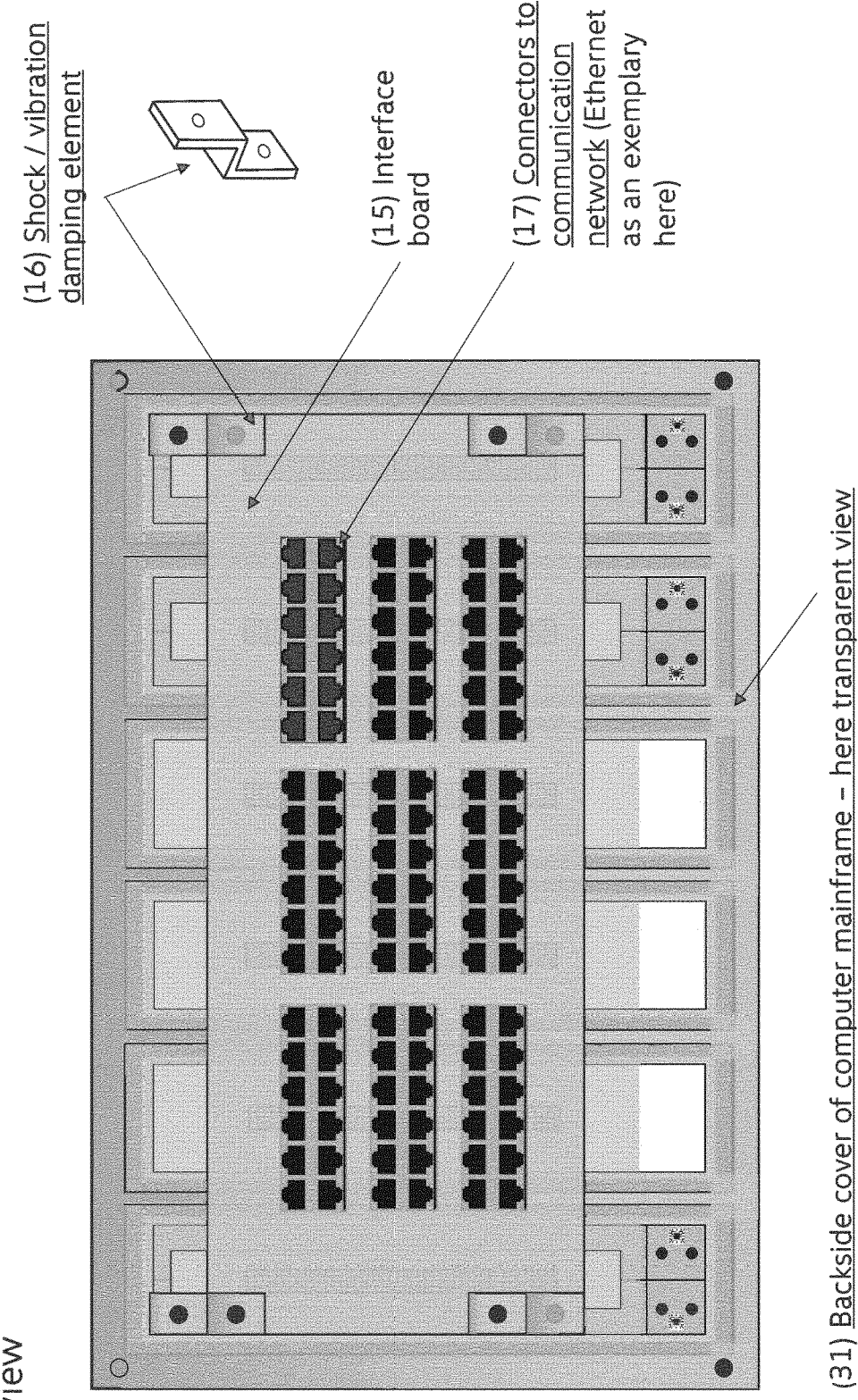

Exemplary configuration of three modules enclosed between cooling blades connected to the mainframe interface board with (31) transparent backside cover – (25) parallel type – backside view

(16) Shock / vibration damping element
(15) Interface board
(17) Connectors to communication network (Ethernet as an exemplary here)
(31) Backside cover of computer mainframe – here transparent view

Fig. 13

Exemplary configuration of three modules enclosed between cooling blades connected to the mainframe interface board with (31) backside cover – (25) parallel type – backside view Exemplary configuration of element (29)
Front view of computer mainframe (29), open – without front cover

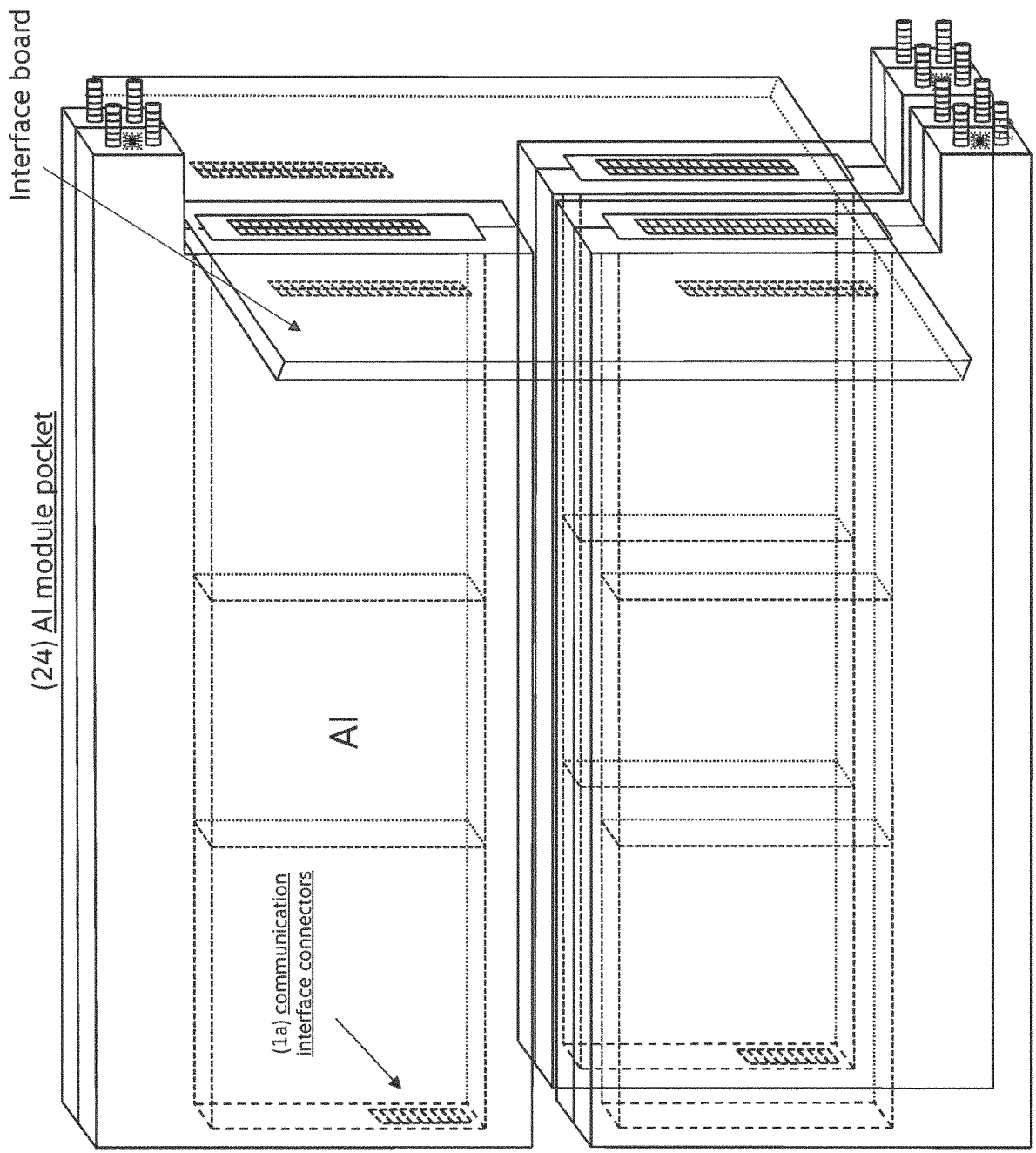
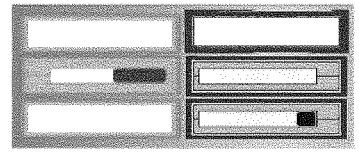
Fig. 17

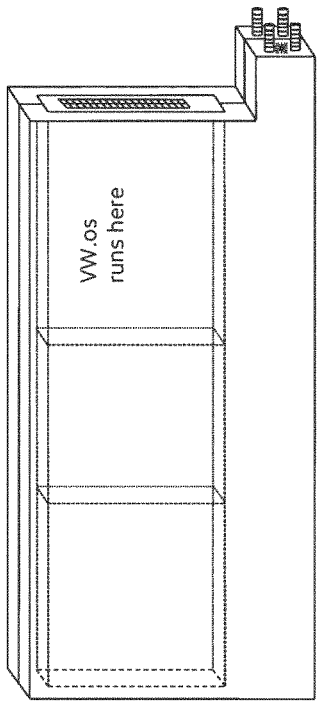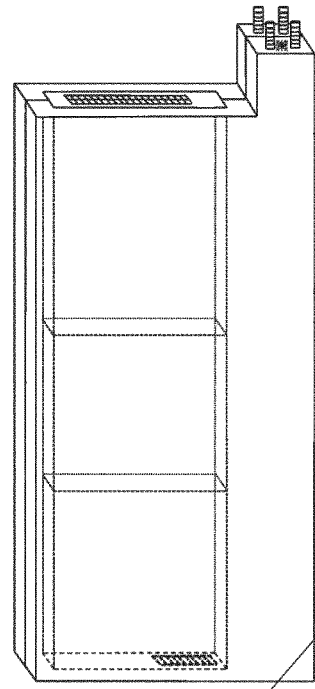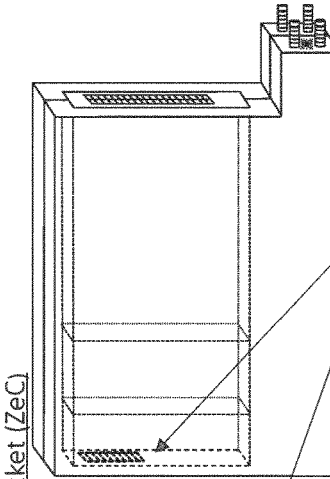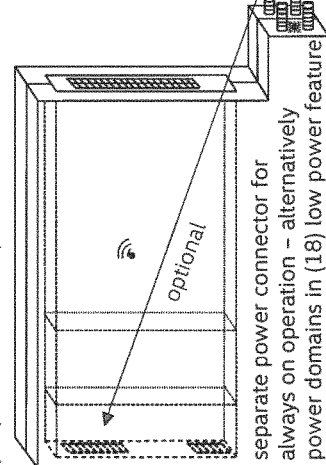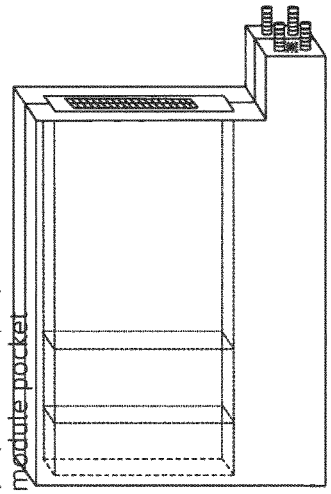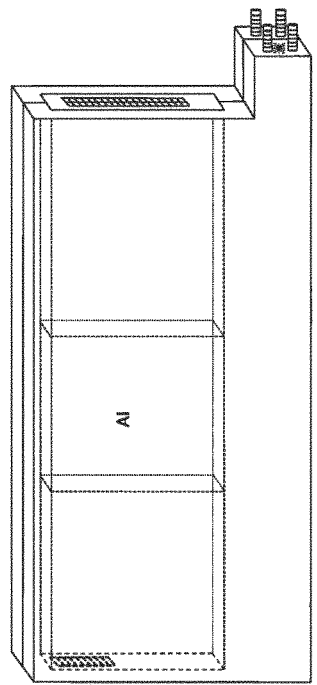
Fig. 18

Exemplary overview about Pocket Module Types
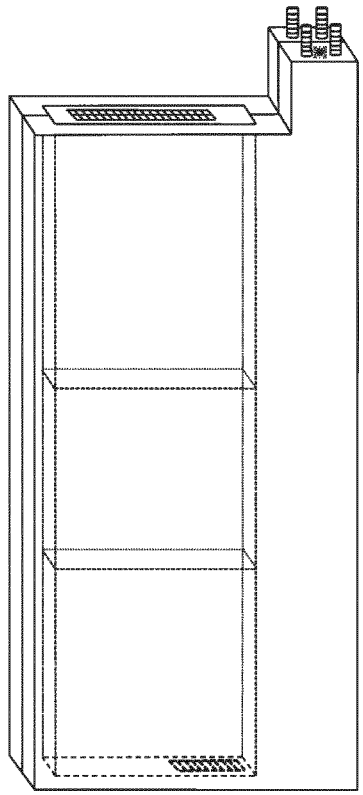
(18) Power module pocket
The power module has a (21) front side connector to the computer mainframe (shock / vibration isolated) connecting to vehicle power
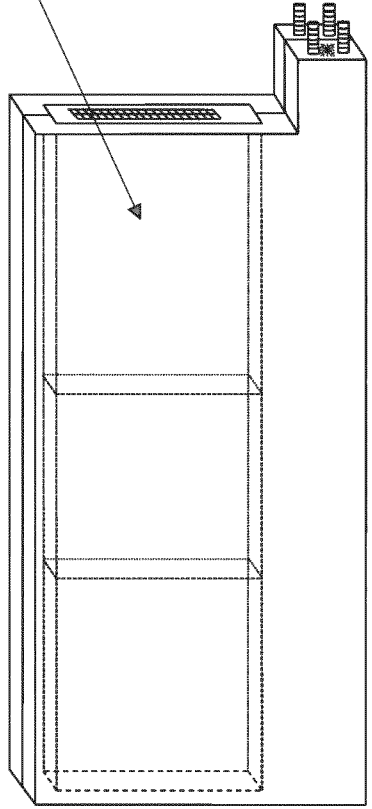
Operating system runs here
(19) Main board module pocket
Fig. 19

Exemplary overview about Pocket Module Types

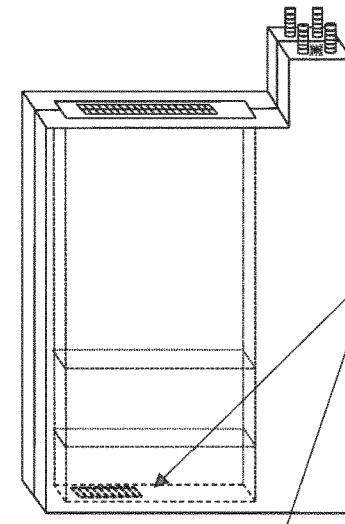

(20) General purpose HW extension module pocket

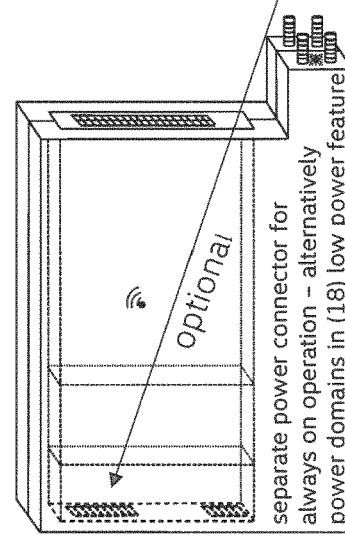

(22) OCU Module pocket

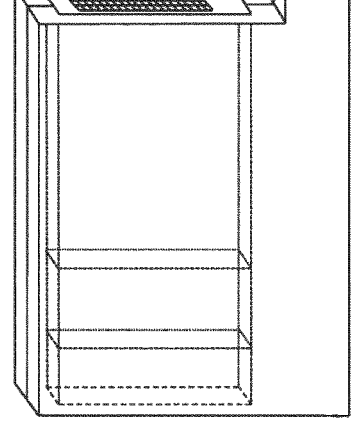

(23) General purpose interface extension module pocket (ZeC)

(1a) communication interface connectors

Easy upgrade option to modern communication interfaces and new sensor types even when wire harness infrastructure is already fixed separate power connector for always on operation – alternatively power domains in (18) low power feature The power module has a (21) front side connector to the computer mainframe (shock / vibration isolated) connecting to vehicle power

Fig. 20

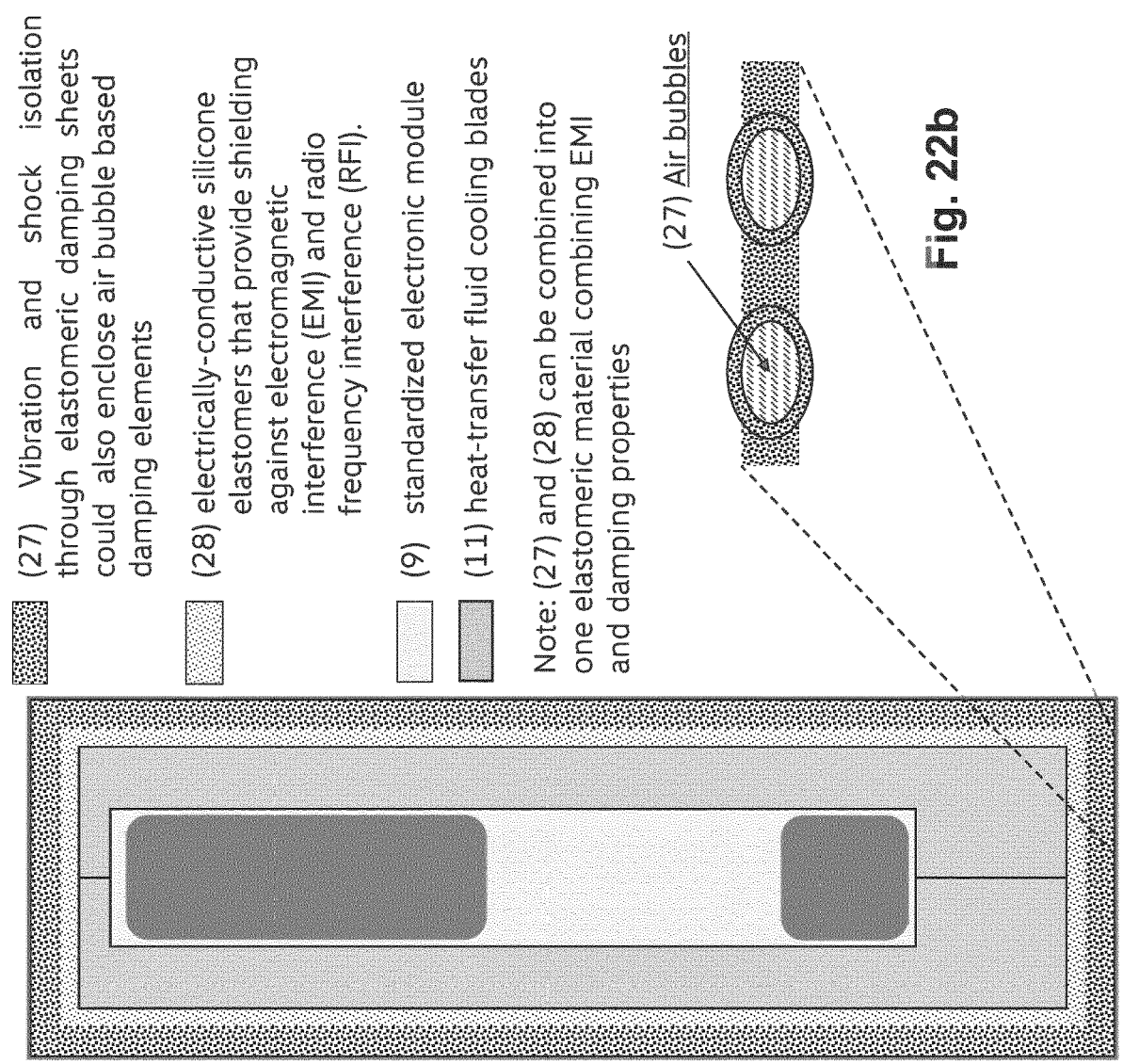

Fig. 22a — Front side view of a module pocket integrated within a (29) mainframe slot Mainframe construction features
- Simple construction: cheaper
- Integrated EMI shielding (28) and shock/vibration absorbers (27)
- Integrated interface board (15)
- Central heat-transfer fluid inlet / outlet supplying to (11)

(27) Vibration and shock isolation through elastomeric damping sheets could also enclose air bubble based damping elements

(28) electrically-conductive silicone elastomers that provide shielding against electromagnetic interference (EMI) and radio frequency interference (RFI).

(9) standardized electronic module

(11) heat-transfer fluid cooling blades

Note: (27) and (28) can be combined into one elastomeric material combining EMI and damping properties Fig. 22b — (27) Air bubbles

VEHICLE, A MAIN FRAME, A MODULE POCKET, AN ELECTRONIC MODULE, AND A PRINTED CIRCUIT BOARD

RELATED APPLICATIONS

The present application claims priority to International Patent App. No. PCT/EP2021/057651 to Andreas Aal, titled "Vehicle, a Main Frame, a Module Pocket, an Electronic Module, and a Printed Circuit Board", filed Mar. 24, 2021, which claims priority to German Patent App. No. 10 2020 204 378.7, filed on Apr. 3, 2020, German Patent App. No. 10 2020 208053.4, filed on Jun. 29, 2020, and German Patent App. No. 10 2020 214 744.2, filed on Nov. 24, 2020, the contents of each being incorporated by reference in their entirety herein.

TECHNICAL FIELD

The present disclosure relates to a central compute unit, especially to a vehicle central compute unit, to a pocket module, to an electronic module, to a printed circuit board, to a cooling blade, and to a main frame. Further the present disclosure relates to manufacturing and to a geometrical concept and arrangement of single elements of the central compute unit, the pocket module, the electronic module and the printed circuit board. Moreover, the present disclosure relates to vehicles, especially to a vehicle architecture and to a construction of a Vehicle Central Compute Unit (V-CCU). More particularly, but not exclusively, the present disclosure relates to a concept for a printed circuit board, which is adapted to the vehicular environment.

BACKGROUND

Central compute units are known to be installed in vehicles. However, there exist several disadvantages to the known solutions. For example, different construction principles of a plurality of hardware or sub-compute units need to be integrated within one vehicle. The coordination of these different hardware or compute units is complex and inefficient.

There seems to be a need for a harmonized approach using different kinds of hardware or compute units in a vehicle provided by different vendors. It would be desirable to use a modular construction. A modular construction principle for electronics is established for many applications like server systems. Also, various Tier1 suppliers of the automobile industry have built their own "rack system". However, existing "modular" Tier1 constructions only cover limited "compute" and "power" domains, such as related to driver assistant systems or infotainment. This approach leads to multiple non-standardized solutions amongst "compute" and "power" domains. Examples are domain compute units that are built on various supplier-based housing and mainboard configurations that are not compatible between each other. As a consequence, multiple power supplies and mainboards plus eventually hardware extensions only mapped to those individual configurations incl. SW are available. As a result, a complex and expensive system integration may be required. At present it can be observed that a huge number of variants for system integration of those compute units (which may be hardware and/or software) exists. This may result in integration design issues that result into non-optimized hardware and also software operation. Functional loss and fail-operations may arise during development as well as during hardware and software maintenance including change management and the like. A key challenge of a central compute unit-based architecture is the change of the software-defined operation principle from an embedded to a non-embedded system that requires hardware co-design with respect to the operating system and its features chosen.

Moreover, electronic components in the vehicular environment are subject to various influences from the environment, such as large temperature differences, mechanical stress and vibrations, electromagnetic influences from other components, e.g. high voltage components, and access attempts by non-qualified parties, e.g. hackers.

SUMMARY

Aspects of the present disclosure are directed to solving the above-mentioned needs. In some examples, an assembled printed circuit board is disclosed, which is configured for an electronic vehicular component. An electronic vehicular component is to be understood as electronic component, component part, or element, which is meant to be used in a vehicle or in the vehicular environment. "One" representative example of an electronic vehicular component is an ECU (electronic control unit) that consists of a PCBA (assembled printed circuit board), a surrounding housing and ECU Software. Within the automotive ecosystem of the last decades, an "electronic component" was generally handled on the design level of ECUs, when not explicitly defined otherwise. That wording was/is different to the wording used in the electronics industry that mostly uses the expression electronic component as a synonym for electronic device. Examples are electronic elements, modules, circuits, or circuitry suited for use in a vehicle, that may use electronic components/parts such as any semiconductor devices or chips, resistors, capacitors, inductors, transistors, diodes, etc.

The printed circuit board may include a thermal distribution layer in the printed circuit board and one or more thermal coupling areas on the surface of the printed circuit board. The one or more thermal coupling areas are configured for heat dissipation away from the printed circuit board and the one or more thermal coupling areas are thermally coupled to the thermal distribution layer in the printed circuit board. Thermal distribution layer and thermal coupling areas enable more efficient heat dissipation, which is adapted to vehicular environment.

For example, the printed circuit board further comprises one or more contacts for grounding the thermal distribution layer. Grounding the thermal distribution layer may further help in protecting components from electromagnetic interference.

The thermal coupling areas may be electrically coupled to the thermal distribution layer. The thermal coupling areas may be grounded together with the thermal distribution layer or vice versa. Keeping thermal coupling areas and the thermal distribution layer on the same potential may further contribute to protecting the printed circuit board from electromagnetic interference, its components, respectively.

In some examples, the printed circuit board may comprise one or more sensors, which are embedded in the printed circuit board. Embedding sensors in the printed circuit board may enable monitoring of certain physical properties of the printed circuit board.

For example, the one or more sensors may comprise at least one element of the group of a temperature sensor, a temperature sensor with energy harvesting device, a mechanical deformation sensor, and a mechanical deformation sensor with energy harvesting device. Embodiments may enable monitoring of temperature, mechanical stress or deformation, and/or energy harvesting in the printed circuit board.

The one or more sensors may comprise at least one combined mechanical deformation and temperature sensor, which may enable monitoring both quantities with one sensor.

In some examples, the printed circuit board may comprise a grid of distributed sensors. The grid of sensor may enable distributed monitoring throughout the printed circuit board.

Some examples also provide an electronic module for a vehicle comprising a printed circuit board as described herein. The electronic module may be adapted to the vehicular environment using the printed circuit board.

For example, the electronic module further comprises electronic components mounted on the printed circuit board and a housing for the printed circuit board with the electronic components. The electronic module further comprises thermal interface material configured to thermally couple the electronic components and the housing. Embodiments may provide an efficient heat dissipation concept adapted to the vehicular environment using the printed circuit board and thermal coupling of the printed circuit board to a housing of the electronic module.

The electronic module may further comprise one or more spacer dice, which are configured to thermally couple the one or more thermal coupling areas of the printed circuit board with the housing. The spacer dice may further contribute to efficient heat dissipation from the printed circuit board to the housing.

Furthermore, thermal interface material, which is configured to thermally couple at least one of the one or more spacer dice to the housing may be used in some examples. Thermal coupling may be enhanced using the thermal interface material.

The spacer dice may be configured to be grounded together with the housing. Such grounding may contribute to electromagnetic shielding of the printed circuit board and electronic components implemented thereon through the housing of the electronic module.

The one or more spacer dice may be further configured to mechanically stabilize the printed circuit board in the housing. Some examples may further enable efficient mechanical stabilization of the printed circuit board in the housing, e.g., over a wider range of temperatures in the vehicular environment.

In some examples the electronic module further comprises a module connector, which is configured to provide an electrical coupling to the printed circuit board from the outside of the electronic module. Examples disclosed herein may enable efficient electrical coupling of the printed circuit board and further electronic components in the vehicle.

The housing may be configured to shield the printed circuit board from electromagnetic radiation. Such shielding may be achieved using a metal housing, e.g., made of aluminum, or using at least a mesh of electrically conducting material to form a Faraday cage around the printed circuit board.

Some examples further provide a pocket module comprising two cooling blades and an electronic module as described herein being in thermal coupling with the two cooling blades. Such a pocket module may provide efficient adaptation of the electronic module to the vehicular environment. Yet another embodiment is a main frame with two or more pocket modules according to the description herein.

The main frame may be configured to absorb mechanical stress from the two or more pocket modules. Some examples may at least partly enable mechanical decoupling of the main frame and the pocket module. In line with the above, the main frame may be configured to shield the pocket module from electro-magnetic radiation.

Another embodiment is a vehicle with a main frame as described herein.

Moreover, a cooling blade may be configured for cooling an electronic module of a vehicle. The cooling blade comprises at least one connector for connecting to a liquid cooling system of the vehicle and a cooling line for guiding a liquid coolant through the cooling blade for heat transfer. The cooling blade further comprises a heat transfer area for thermal coupling of the electronic module. With the cooling blade a scalable and universal heat transfer interface is provided for integration of electronic modules in a vehicle.

The cooling line may be encapsulated in the cooling blade, which may enable an efficient and effective cooling concept for electronic modules.

In some examples, the cooling blade may be configured to separate the electronic module from the liquid coolant. Electronic components may be well isolated from the liquid cooling. For example, the cooling blade can further comprise one or more humidity sensors for leakage monitoring, such that a leakage may become detectable before significant damages can result therefrom.

Furthermore, the cooling blade may comprise a metal housing with a ground connector. Such that the cooling blade may further be used as electromagnetic shielding for the electronic module.

At the cooling blade the area for thermal coupling of the electronic module may be configured to sandwich the electronic module together with another cooling blade. An even more effective heat dissipation concept may result if the electronic module is sandwiched between two cooling blades, for example, an overall area for thermal coupling may be doubled.

In some examples, the cooling blade may be configured to form a cavity for the electronic module together with another cooling blade. That way, a significant part of an outer surface of the electronic module may be used for heat transfer to the cooling blades.

The cavity may be configured to allow the electronic module to connect with a main frame interface of a main frame, which is configured to hold the cooling blade. In some examples, a heat transfer area between a cooling blade and an electronic module may be large but still allow for electronic connection to a main frame interface. For example, the cavity may be also configured to allow the electronic module to connect to another component using a front side connector of the electronic module. The front side connector can be arranged on an opposite side of the main frame interface (which may be on the back side) of a housing of the electronic module. In some examples, the cooling blade may allow for proper electronic coupling to the vehicle and its components while still assuring effective heat dissipation.

Furthermore, the cooling blade may be configured to cool electronic modules within a predetermined form factor range. The cooling blade may then become a universal cooling, shielding and protection adapter for electronic modules in the form factor range.

Some examples also provide a pocket module, which comprises two cooling blades as described herein and an electronic module. In some examples, a main frame may be configured with one, two or more pocket modules. The main frame may be configured to absorb mechanical stress from the one, two or more pocket modules. The main frame may be further configured to shield the pocket module from electro-magnetic radiation while also blocking electro-magnetic emission from the module itself. In some examples, a vehicle is disclosed with such a main frame.

BRIEF DESCRIPTION OF THE DRAWINGS

Some other features or aspects will be described using the following non-limiting embodiments of apparatuses or methods or computer programs or computer program products by way of example only, and with reference to the accompanying figures, in which:

FIGS. 3a and 3b depict cross sections of an electronic module under some aspects of the present disclosure;

FIGS. 4a and 4b show a printed circuit board (PCB) construction under some aspects of the present disclosure;

FIG. 7 depicts electronic modules connected to a main frame interface under some aspects of the present disclosure;

FIGS. 9a and 9b illustrate a configuration of three pocket modules in a main frame under some aspects of the present disclosure;

FIG. 10 depicts a main frame interface in a configuration of three pocket modules in a main frame under some aspects of the present disclosure;

FIG. 13 illustrates further details on a backside cover of a mainframe under some aspects of the present disclosure;

FIG. 17 depicts further details on the alternative configuration of three pocket modules in a main frame under some aspects of the present disclosure;

FIG. 18 shows different pocket module configurations or types under some aspects of the present disclosure;

FIG. 19 illustrates different pocket module types under some aspects of the present disclosure;

FIG. 20 depicts further pocket module types under some aspects of the present disclosure;

FIGS. 22a and 22b illustrate integration of a pocket module under some aspects of the present disclosure.

DETAILED DESCRIPTION

Various example embodiments will now be described more fully with reference to the accompanying drawings in which some example embodiments are illustrated. In the figures, the thicknesses of lines, layers or regions may be exaggerated for clarity. Optional components may be illustrated using broken, dashed or dotted lines.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the present disclosure. Like numbers refer to like or similar elements throughout the description of the figures.

As used herein, the term "or" refers to a non-exclusive or, unless otherwise indicated (e.g., "or else" or "or in the alternative"). Furthermore, as used herein, words used to describe a relationship between elements should be broadly construed to include a direct relationship or the presence of intervening elements unless otherwise indicated. For example, when an element is referred to as being "connected" or "coupled" to another element, the element may be directly connected or coupled to the other element or intervening elements may be present. In contrast, when an element is referred to as being "directly connected" or "directly coupled" to another element, there are no intervening elements present. Similarly, words such as "between", "adjacent", and the like should be interpreted in a like fashion.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" or "including", when used herein, specify the presence of stated features, integers, steps, operations, elements or components, but do not preclude the presence or addition of one or more other features, integers, steps, operations, elements, components or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 5A:
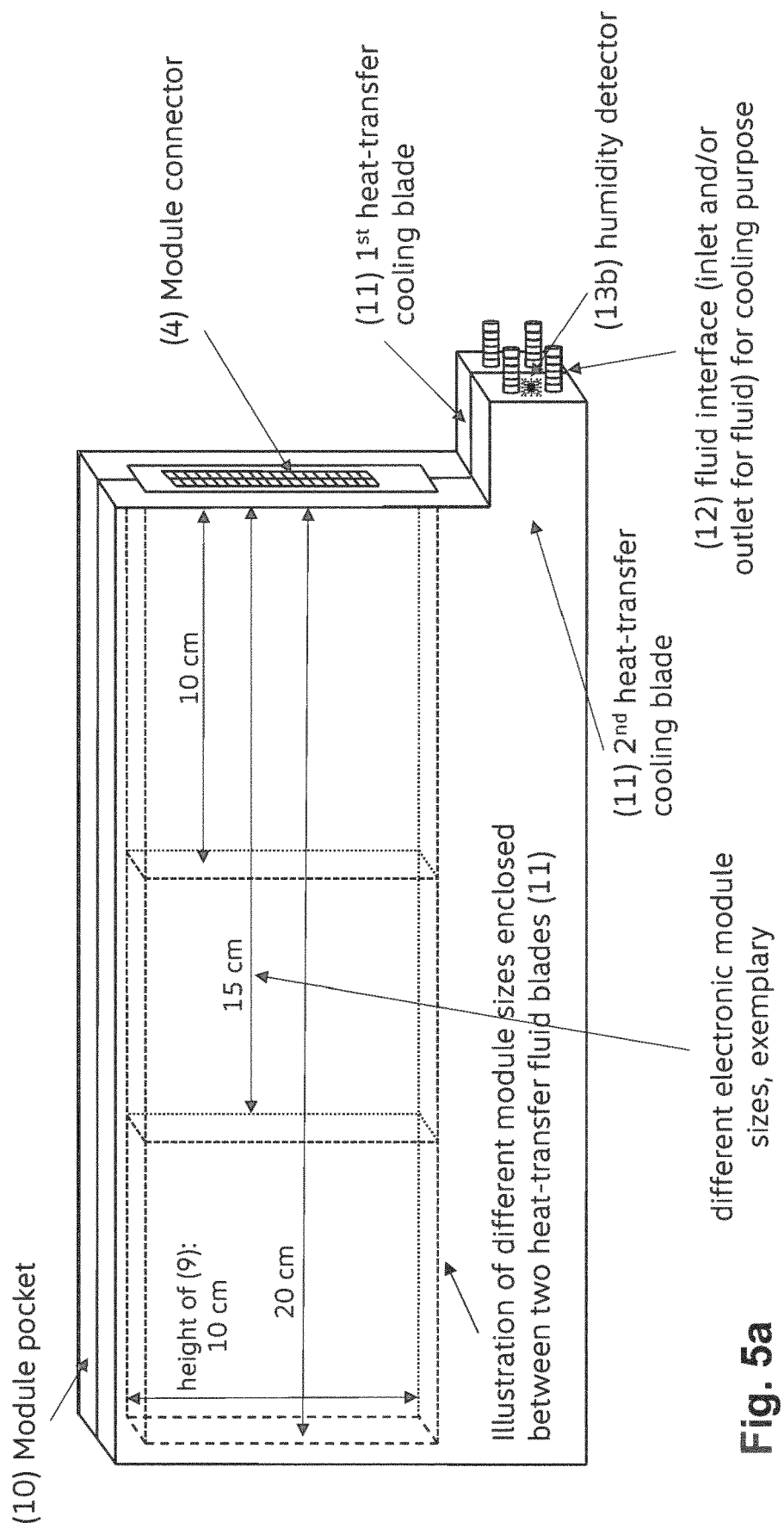
FIG. 5a illustrates a pocket module comprising two cooling blades under some aspects of the present disclosure.

Overall, the present disclosure especially relates to automotive vehicles and addresses challenges of HW/SW co-design approaches from an electronic function perspective that require also a corresponding system engineering-based co-design on the construction-architecture side of a vehicle computer. According to the concept of the present disclosure, parts within a Vehicle Central Compute Unit (V-CCU) are exchangeable and variable in size. The Vehicle Central Compute Unit (V-CCU) combines a plurality of single hardware units within one Vehicle Central Compute Unit (V-CCU) that also can include redundant units. Thus the present disclosure enables exchangeable and extendable hardware and is able to integrate different sizes of (compare to FIG. 18) power supplies, main boards, extension boards, etc. within a pre-defined form-factor range from different vendors of the supply chain. Also, within the pre-defined form-factor-range plus some standardized board design-rules, the cooling and fixation of the PCBs is standardized and independent of the size (compare to FIG. 5a) of the PCBs. FIG. 5a illustrates a flexible module size in horizontal direction. In further embodiments, the flexible sizing could be in another or in multiple directions, e.g. in the vertical direction. Moreover, the interface/module connector 4 is shown on the backside of the module, in further embodiments an interface board could be on the bottom side or there could be multiple interfaces/connectors.

In this context the following meanings are utilized:
PCB=Printed Circuit Board
PCBA=assembled Printed Circuit Board
CCU=Central Compute Unit (CCU)
V-CCU=Vehicle Central Compute Unit
The expressions CCU and V-CCU are used within this context interchangeably in relation to a vehicle application
ECU=Electronic Control Unit
EMC=electromagnetic compatibility
EMI=electromagnetic interference
ESD=electrostatic discharge
OCU=Onboard Connectivity Unit
RFI=radio frequency interference
ASIL=Automotive Safety Integrity Level
HW=Hardware
SW=Software
ESD=electrostatic discharge
T: temperature
SAC: Sensor/Actuator Cluster
ZeC: Zone electrical Controller The expressions module, module pocket or pocket module are used within this context interchangeably.

Further exemplary advantages provided by the present disclosure and advantages of exemplary embodiments thereof are as follows:
protection of solder joints against mechanical and thermal stress,
protection of electronic components/packages against mechanical and thermal stress
deformation and thermal sensor for overstress detection (i.e. car accident, thus, clear decision whether HW needs to be exchanged), thus, increased functional safety,
many distributed thermal sensors for the overstress detection can potentially also be used for intrusion detection of certain cyber security attacks that create "thermal" deviations,
EMC/EMI and ESD performance, therefore, reduced compensation via additional components required,
no direct shock transfer from hardware housing to electronic components, thus solder ball cracks can be avoided, therefore no functional loss and no signal distortion and no wrongly assumption of software bugs,
providing power supply scalability with hardware compute scaling providing cooling scalability with hardware scaling,
ASIL (Automotive Safety Integrity Level) conform heat-transfer fluid cooling, therefore, no limitations for safety functions,
robust heat-transfer fluid cooling construction,
Thermal, mechanical and EMI (electromagnetic interference) shielding design through "one" construction principle from PCB design connecting to electronic module housing connection to cooling blade connection to shock/vibration resistant mainframe slot,
cost reduced mainframe construction (reduced part of metal), simplicity of design,
no proprietary mainboard solution (compatible between vendors) and open for all, vendors providing hardware upgrades/interchanges,
architecture matchable to operating system of the car manufacturer,
overall, high energy efficiency is provided,
Installed sensors may provide an up-front monitoring for initiating precaution measures for avoiding drop out of electric components, thus the probability of a fault or failure is minimized,
Due to the provided geometry aiming in homogenizing thermal stress to the electronic components a robust concept is provided,
The housing of the central compute unit is scalable in view of power supply and the amount of power, size of electronic modules and number of integrated electronic modules, and
The provided solution provides a robust concept in view of mechanical construction, electromagnetic shielding and thermal robustness.

Further advantages, features and applications of the present disclosure are provided in the following detailed description and the appended figures, wherein:

FIG. 1 to FIG. 23 illustrate exemplary embodiments of the invention.

Figure 1:
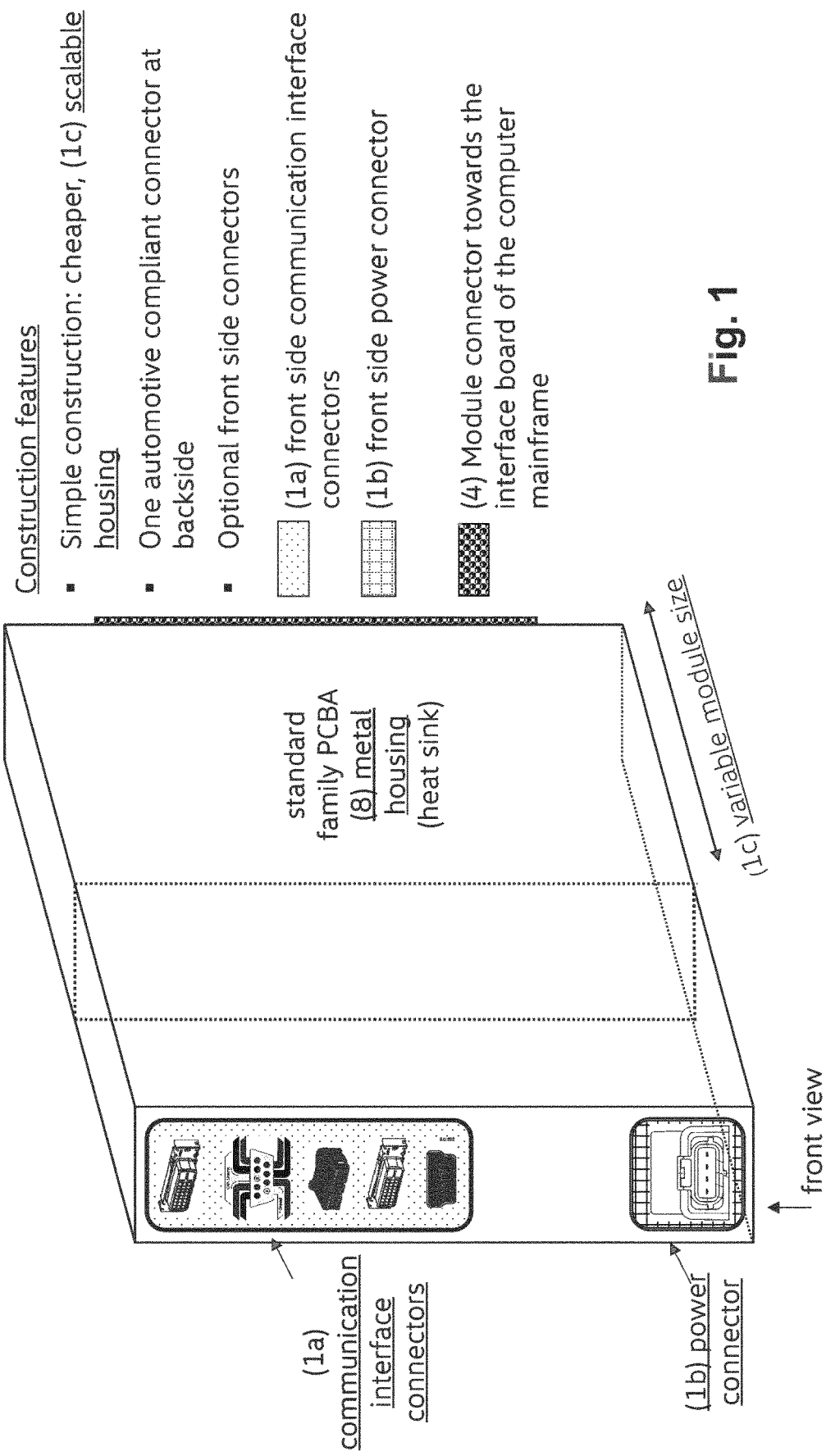
FIG. 1 shows an electronic module construction under some aspects of the present disclosure.

FIG. 1 shows an electronic module construction in an embodiment. In FIG. 1 an electronic module 9 is shown as standardized electronic module construction. The electronic module has communication interface connectors 1a and a power connector 1b at its front side and a module connector 4 at its back side to connect towards an interface board of a computer mainframe for which details will be outlined subsequently. The electronic module 9 comprises a standard family PCBA metal housing 8 as heat sink. In this embodiment front height and width of the module are standardized but its depth 1c contributes to a variable module size and scalability.

Figure 2:
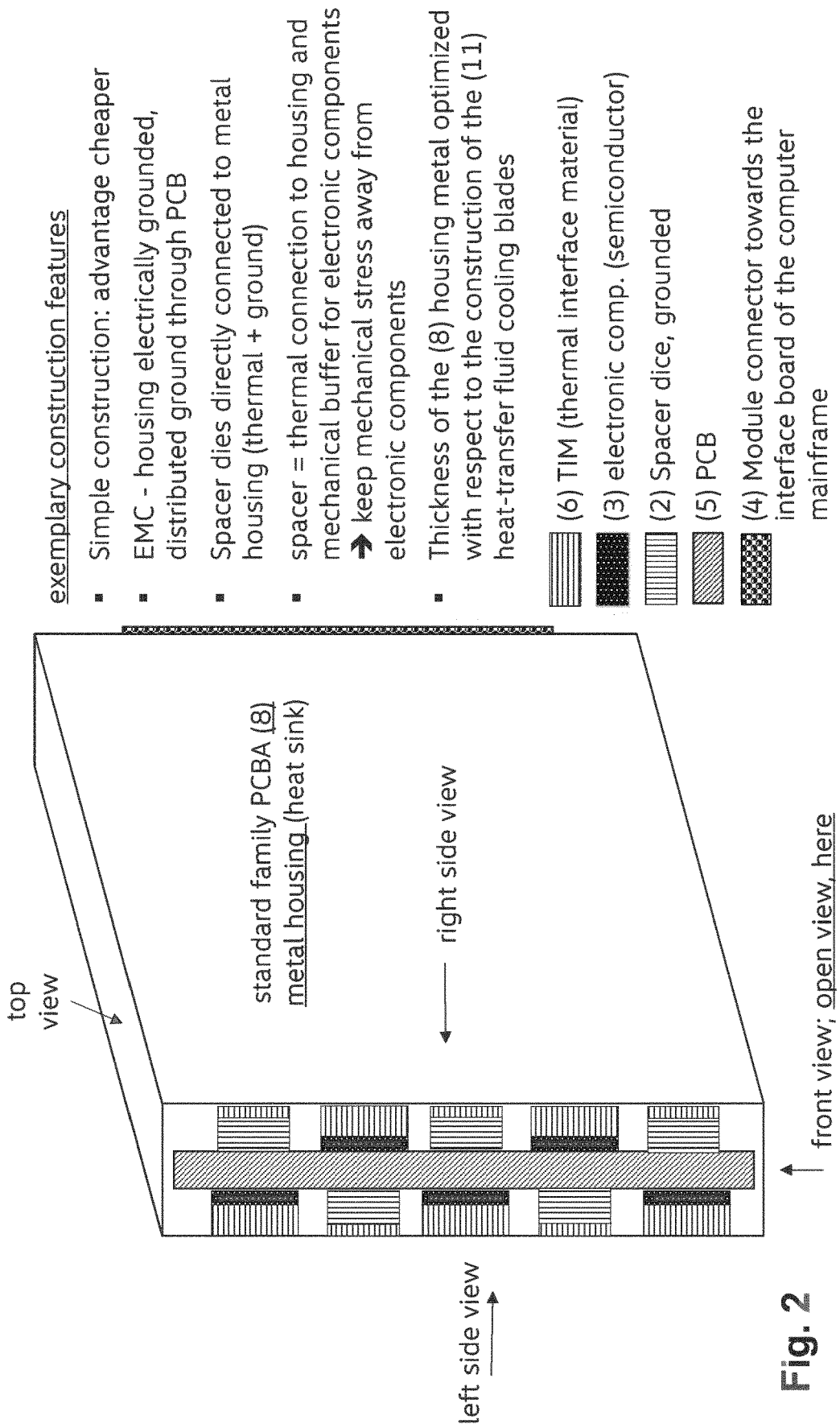
FIG. 2 shows an electronic module construction with further details on an inner construction under some aspects of the present disclosure.

FIG. 2 shows an electronic module construction in an embodiment with more details on an inner construction. FIG. 2 shows the same perspective as FIG. 1 with some insight into the standard family PCBA metal housing 8. Inside the housing 8 there is the PCB 5 with a number of electronic components 3 (e.g., semiconductor components). As can be seen, the electronic components are thermally coupled to the housing 8 using thermal interface material 6 (TIM). On the PCB 5 there are spacers 2 (spacer dice), which are grounded, and which mechanically and thermally couple the PCB 5 to the housing 8. The PCB 5 is thereby stabilized against thermal and mechanical stress. By grounding the spacers 2 and the housing 8, protection against electromagnetic interference (EMI) and electromagnetic compatibility (EMC) can be achieved. Some further exemplary construction features are a simple and cheap construction. EMC can be achieved by electrically grounding the housing 8 and having distributed ground through PCB 5. The spacer dice 2 can be directly connected to the metal housing 8 thereby achieving thermal and ground coupling. A spacer 2 can be a thermal connection to the housing 8 and a mechanical buffer for electronic components 3. Mechanical stress can be kept away from or at least be reduced for electronic components. A thickness of the housing metal 8 may be optimized with respect to the construction of the heat-transfer fluid cooling blades 11 as will be shown in the subsequent Figures.

FIGS. 3a and 3b depict cross sections of an electronic module 9 under some aspects of the present disclosure. The electronic module 9 for a vehicle comprises a PCB 5, which will be described in more detail subsequently. The electronic module 9 comprises electronic components 3 mounted on the PCB 5 and a housing 8 for the PCB 5 with the electronic components 3. The electronic components 3 may comprise any semiconductor devices or chips, resistors, capacitors, inductors, transistors, diodes, etc.

The electronic module 9 further comprises thermal interface material 6 (TIM) configured to thermally couple the electronic components 3 and the housing 8. For example, the TIM 6 may be any heat conducting material such as copper or aluminum that may be used within a paste or flexible material. Also non electrically conducting heat transfer materials such as thermal foils do fall under this category. The TIM connection may also be realized through a solder connection or coupling, even if it rendered a manufacturing process more challenging.

Moreover, the electronic module 9 comprises one or more spacer dice 2, which are configured to thermally couple one or more thermal coupling areas of the PCB 5 with the housing 8. The spacer dice may not exactly be symmetric dice but have a cubic or almost cubic size, e.g., they may be some sort of heat conducting cushions. As for all heat conducting components described herein, heat conducting material may be used, e.g. in form of powder, fibers, lanes, grid, mesh, crystalline, massive, etc. Optionally, TIM 6 may be used to thermally couple at least one of the one or more spacer dice 2 to the housing 8.

Furthermore, the spacer dice 2 can be configured to be grounded together with the housing 8. The housing 8 is configured to shield the PCB 5 from electromagnetic radiation. The one or more spacer dice 2 are further configured to mechanically stabilize the PCB 5 in the housing 8. Therefore, the spacer dice may be implemented using a material that provides some mechanical robustness itself.

FIG. 3a shows a cross section of a PCB 5 with electronic components 3, spacer dice 2, TIM 6, and a module housing 8. FIG. 3b depicts a magnified cross section of the PCB 5. Here, it can be seen that the PCB 5 comprises a grounded thermal heat distribution layer 7, which is connected to the spacer dice 2. In some examples, TIM 6 on the electrical components 3 can be optional as ideally, the heat distribution layer 7 provides enough heat dissipation.

The PCB 5 for the electronic vehicular component comprises the thermal distribution layer 7 in the PCB 5. The PCB may be seen as a sort of carrier for the electronic components 3 that has certain conductor lines, vias, and contacts implemented on a basically non-conductive carrier substrate. A PCB 5 may have several layers of conductor planes, of which at least some can be electrically contacted from the surface of the PCB 5.

The thermal distribution layer 7 may be implemented using a laminar or plane implementation of heat-conducting material, e.g., such material could be metal such as copper or aluminum. The implementation could be as a plane, as multiple lanes, meanders, a mesh, a grid etc. The thermal distribution layer 7 is shown as being implemented in the center of the PCB 5, e.g., it could be a layer laminated into the PCB5, which can be in the middle of the PCB 5, but it may as well be implemented asymmetrically, e.g., closer to one surface of the PCB 5 than to another. The PCB 5 comprises one or more thermal coupling areas on the surface of the PCB 5. These areas are located between the electronic components 3 in FIG. 3a and are coupled to the spacer dice 2. The one or more thermal coupling areas are configured for heat dissipation away from the PCB 5 and the one or more thermal coupling areas are thermally coupled to the thermal distribution layer 7 in the PCB 5. Therewith, heat is distributed in the PCB 5 and can be led of the PCB 5 through the thermal coupling areas.

In the present embodiment the PCB 5 comprises one or more contacts for grounding the thermal distribution layer 7. In some embodiments the thermal coupling areas are electrically coupled to the thermal distribution layer 7, which may support shielding of the electronic components 3.

Figure 3C:
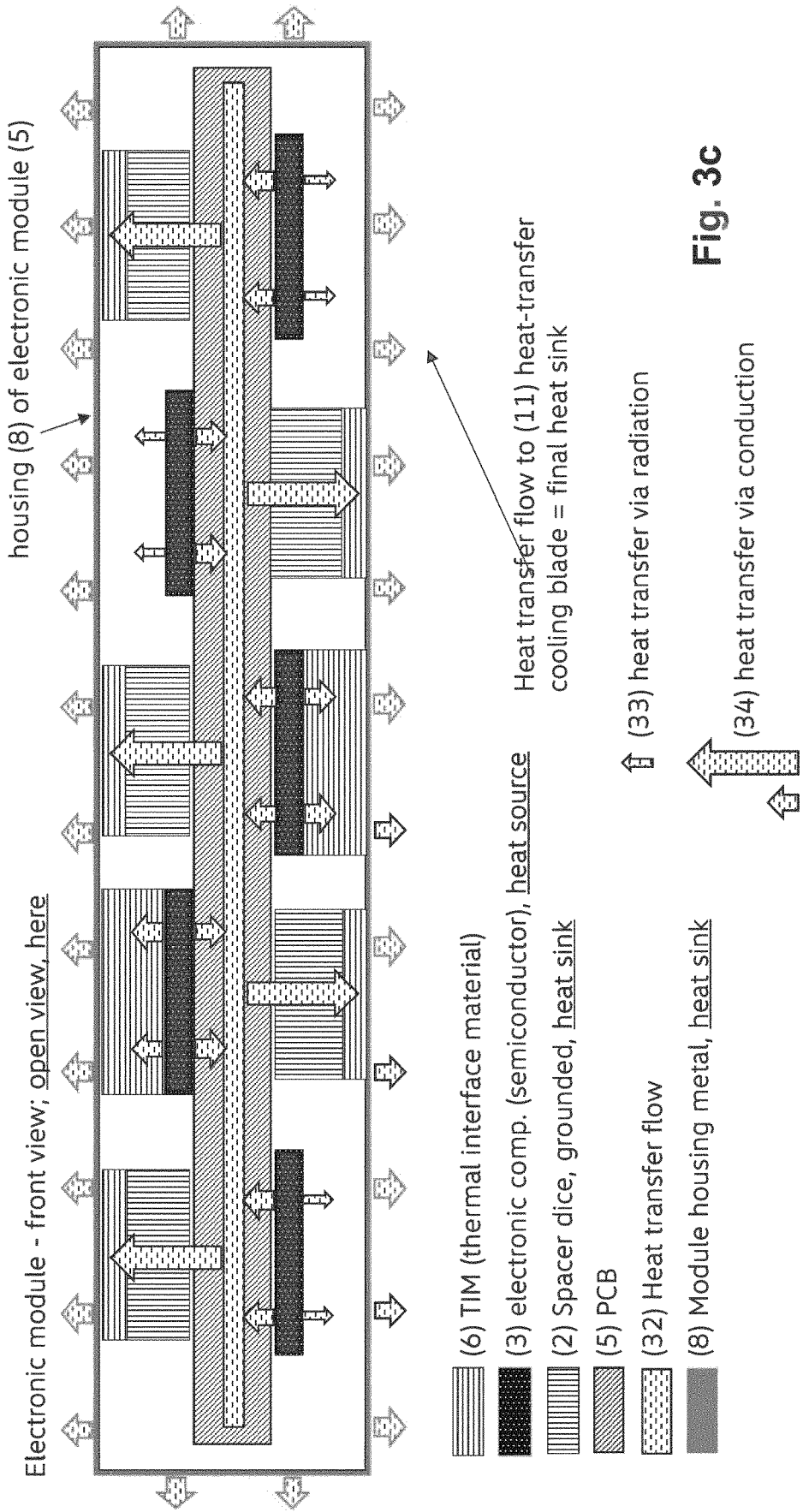
FIG. 3c illustrates a cross section of an electronic module with heat flow indications under some aspects of the present disclosure.

FIG. 3c illustrates a cross section of an electronic module under some aspects of the present disclosure with heat flow indications. As can be seen there is heat transfer via radiation 33 (e.g., from electrical components 3 towards the housing 8 if no TIM 6 is used) and heat transfer via conduction 34 (e.g., through the spacers 2 and the TIM 6).

FIGS. 4a and 4b show more details on a PCB 5 construction under some aspects of the present disclosure. FIG. 4a is a top view of what has been detailed with respect to the previous Figs. FIG. 4b shows a lateral cross section view of the PCB 5. Sensors 13a are embedded in an inner layer of the PCB. These sensors may detect thermal and mechanical stress. The sensors 13a are distributed throughout the PCB 5 and may as well help in intrusion detection concepts, e.g., to enable plausibility checks on whether thermal or mechanical stress is or has been present.

As further shown in FIGS. 4a and 4b the PCB 5 and the electronic module 9 further comprise a module connector 4, which is configured to provide an electrical coupling to the PCB 5 from the outside of the electronic module 9, cf. FIG. 2. The connector 4 can be mounted on the PCB 5 and the housing 8 may comprise an according opening for connecting to the PCB 5. As can be seen in FIG. 4b, the PCB 5 comprises one or more sensors 13a embedded in the PCB 5. Such a sensor may be laminated into the PCB 5. The one or more sensors 13a may comprise at least one of a temperature sensor, a temperature sensor with energy harvesting device, a mechanical deformation sensor, and a mechanical deformation sensor with energy harvesting device. In some examples, a sensor may include or be implemented as an energy harvesting device, which may be configured to collect small amounts of ambient energy to power wireless devices, e.g., for wirelessly communicating information on temperature, pressure, mechanical deformation etc. In some examples, sensors may be implemented as combined devices, i.e., as sensor for measuring a quantity and as energy harvesting device. Furthermore, the one or more sensors 13a may comprise at least one combined mechanical deformation and temperature sensor.

Figure 4C:
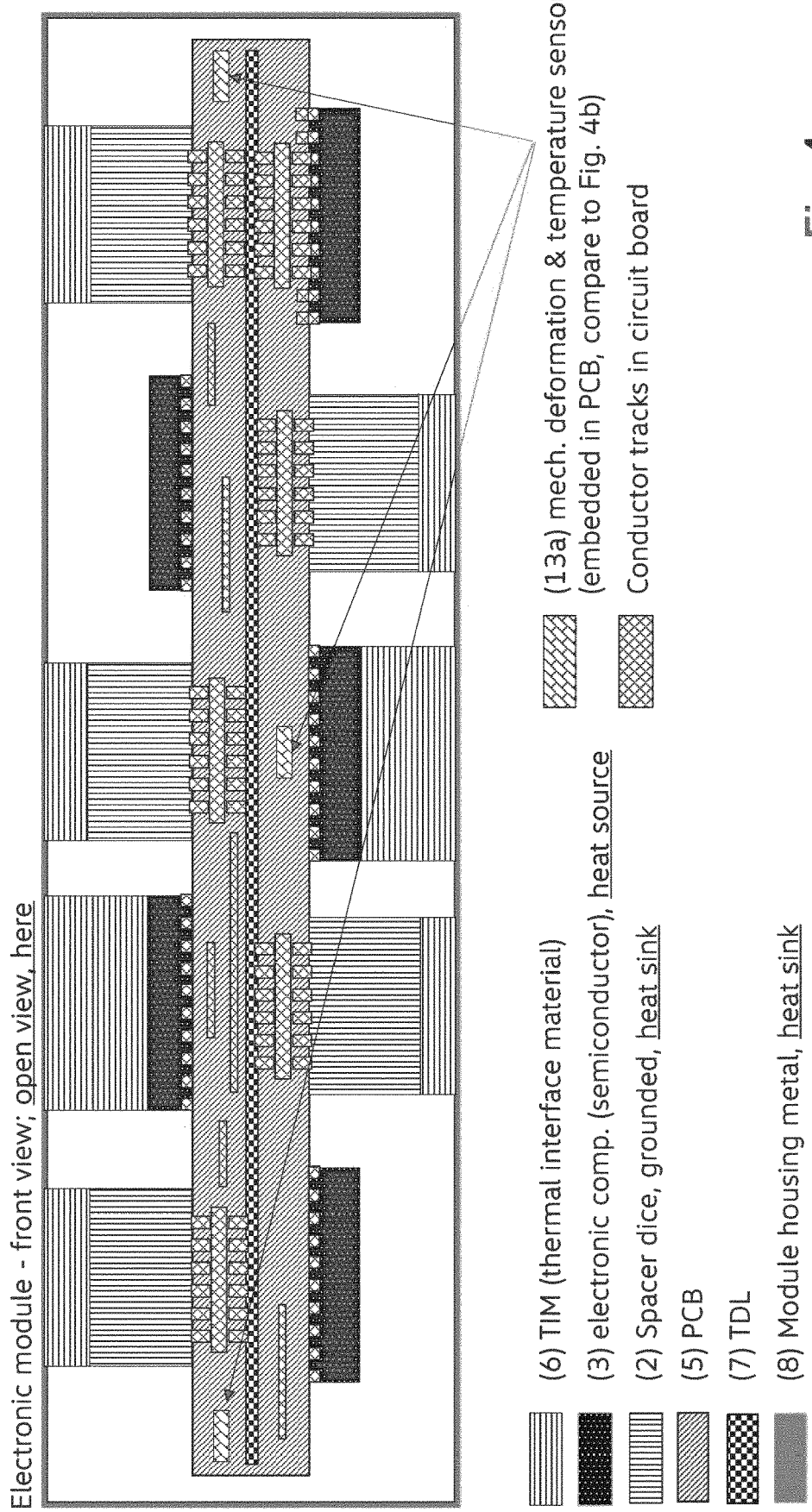
FIG. 4c depicts a PCB construction under some aspects of the present disclosure.

The sensors may be used to determine critical conditions of the PCB 5 and/or the electronic components 3. For example, critical temperature or deformations conditions may be detected an according counter measures may be applied, e.g., switching to an emergency mode or operation of the system to avoid damages. Furthermore, at least in some embodiments, hacker attacks (software and/or hardware based) may be detected through heat detection and/or heat deviation detection on the PCB 5. Heat detected for a certain electronic component 3 may allow conclusions on such an attack. As further illustrated in FIGS. 4a, 4b, and 4c the PCB 5 comprising a grid, mesh or pattern of distributed sensors 13a. FIG. 4c depicts a PCB construction under some aspects of the present disclosure in a cross-sectional view with the deformation and temperature sensors 13a.

FIG. 5a illustrates a pocket module comprising two cooling blades 11 under some aspects of the present disclosure. The module pocket 10 comprises two cooling blades 11 and an electronic module 9 as described herein. The electronic module 9 is in thermal coupling with the two cooling blades 11. The thermal coupling can be achieved using TIM, a laminar contact, heat conducting adhesive or oil. Each of the cooling blades 11 is configured to cool the electronic module 9 of a vehicle. A cooling blade 11 comprises at least one connector 12 for connecting to a liquid cooling system of the vehicle and a cooling line (running to the wall of the cooling blade in FIG. 5a) for guiding a liquid coolant through the cooling blade for heat transfer. The connector 12 is implemented as fluid interface (inlet and/or outlet for fluid) for cooling purposes. In FIG. 5a the connector 12 is shown as one inlet and one outlet per cooling blade 11 resulting in a quadratic arrangement of the connectors 12 in the assembled state in FIG. 5a (two cooling blades 11 forming a module pocket 10). Furthermore, as shown in the geometry in FIG. 5a, the connectors 12 are placed with an offset relative to the rest of the backside surface of the cooling blade 11, e.g. on a shoulder or step of the cooling blade housing. That way, connecting planes for cooling liquid and electrical coupling (e.g. Ethernet) can be offset, which can be advantageous in case of cooling liquid leakage. As further shown in FIG. 5a the connectors 12 are located at the bottom of the cooling blade, so dropping cooling fluid would drop in a direction away from electronics.

In some examples, the cooling blade 11 may be configured to form a pocket module 10 together with another cooling blade 11. The cooling blade 11, the pocket module 10, respectively, is configured to cool an electronic module 9 of a vehicle. For example, the electronic module 9 comprises a printed circuit board 5 in a housing 8. The housing 8 of the electronic module 9 is decoupled from the liquid cooling system. For example, the housing 8 is passive and/or without a connection to the liquid cooling system of the vehicle. The cooling blade 11 may comprise at least one connector 12 for connecting to a liquid cooling system of the vehicle and a cooling line for guiding a liquid coolant through the cooling blade 11 for heat transfer. The cooling blade 11 may further comprise a heat transfer area for thermal coupling of the housing 8 of the electronic module 9.

In some examples, the cooling blades 11 may be made of light material, e.g., aluminum. The lighter the structure the less a mechanical stress on coupling or fixation components evoked by the vibration present in a vehicle. Moreover, aluminum provides good heat conduction properties for heat dissipation away from the module.

The cooling blade 11 further comprises a heat transfer area for thermal coupling of the electronic module 9. The heat transfer area is the inner surface being directed towards the electronic module in FIG. 5a. In FIG. 5a the cooling line is encapsulated in the cooling blade and each of the cooling blades is configured to separate the electronic module from the liquid coolant. As further shown in FIG. 5a the cooling blade further comprises a humidity sensor/detector 13b for leakage monitoring. The cooling plates 11 further comprise metal housings with a ground connector.

As can be further seen in the example of FIG. 5a the area for thermal coupling of the electronic module 9 is configured to sandwich the electronic module 9 together with another cooling blade 11. The cooling blades 11 form a module pocket 10 for the electronic module 9. The arrangement with the two cooling blades 11 forms an embodiment of a pocket module 10 comprising two cooling blades 11 and an electronic module 9. The two cooling blades 11 are configured to form a cavity (pocket) for the electronic module 9 together with each other. FIG. 5a hence illustrates a module pocket integration of standardized electronic module housings 9 between two heat-transfer fluid cooling blades 11.

As further shown in FIG. 5a, the cavity is configured to allow the electronic module 9 to connect with a main frame interface via module connector 4 of a main frame, which is configured to hold the cooling blade 11.

As further shown in FIG. 5a, the cooling blade 11 is configured to cool electronic modules within a predetermined form factor range. The cooling blade 11 is configured to cool electronic module of different sizes, e.g., with depths of 10 cm, 15 cm, or 20 cm (cm=Centimeter).

Figure 5B:
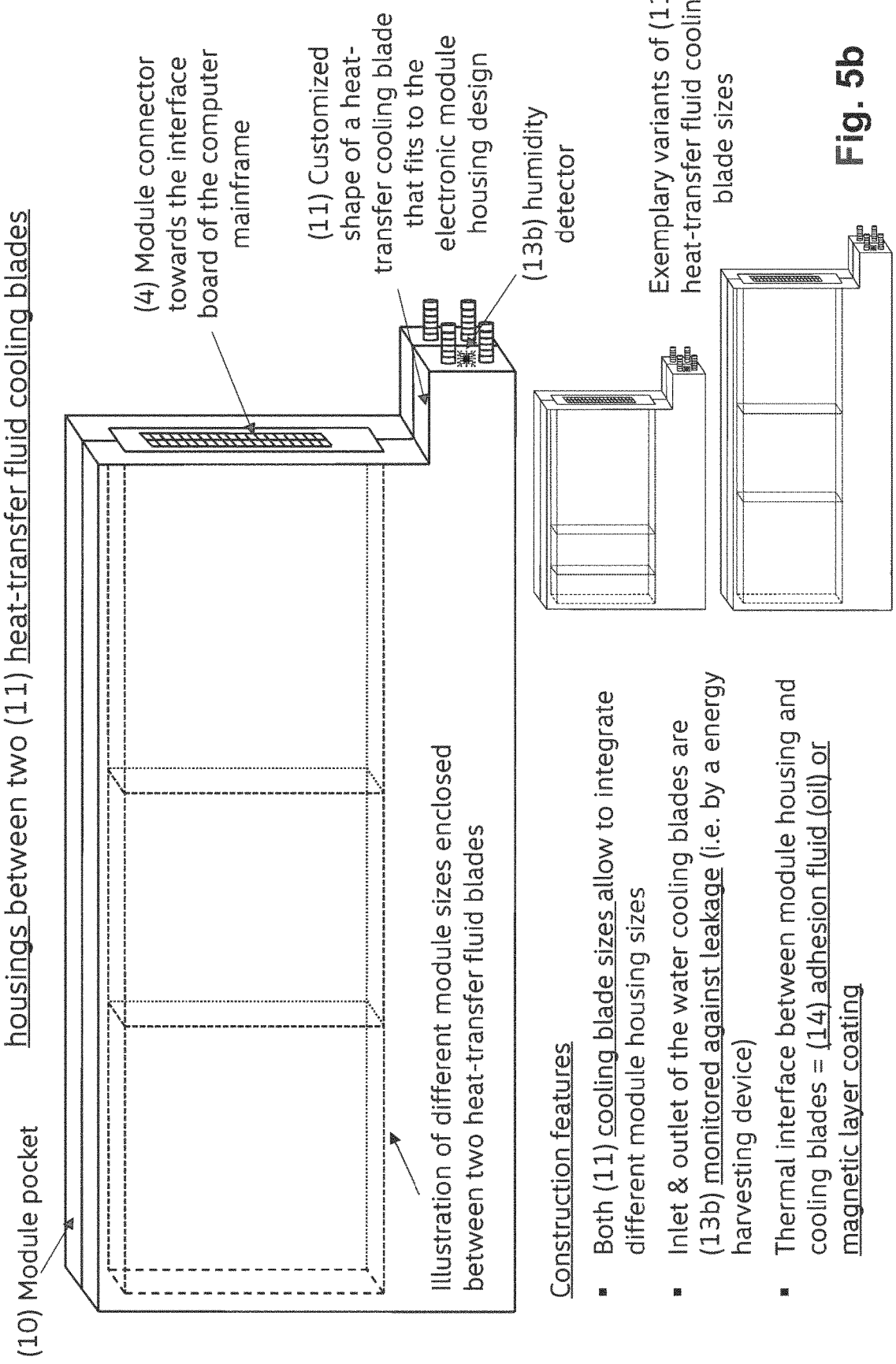
FIG. 5b shows a pocket module comprising two cooling blades under some aspects of the present disclosure.

FIG. 5b shows a pocket module 10 comprising two cooling blades 11 under some aspects of the present disclosure. In the embodiment shown in FIG. 5b a customized shape of a heat-transfer cooling blade 11 that fits to the electronic module housing 9 design may be used. This is shown at the bottom of FIG. 5b, where cooling blades 11 of different depths are shown as exemplary variants of heat-transfer fluid cooling blade sizes. Both cooling blade sizes allow to integrate different module housing sizes. Inlet & outlet of the water-cooling blades are monitored against leakage using a sensor, e.g., by an energy harvesting device. A thermal interface between module housing 9 and cooling blades 11 (heat transfer area for thermal coupling of the electronic module 9) may use an adhesion fluid (oil) or magnetic layer coating for better coupling.

Figure 6B:
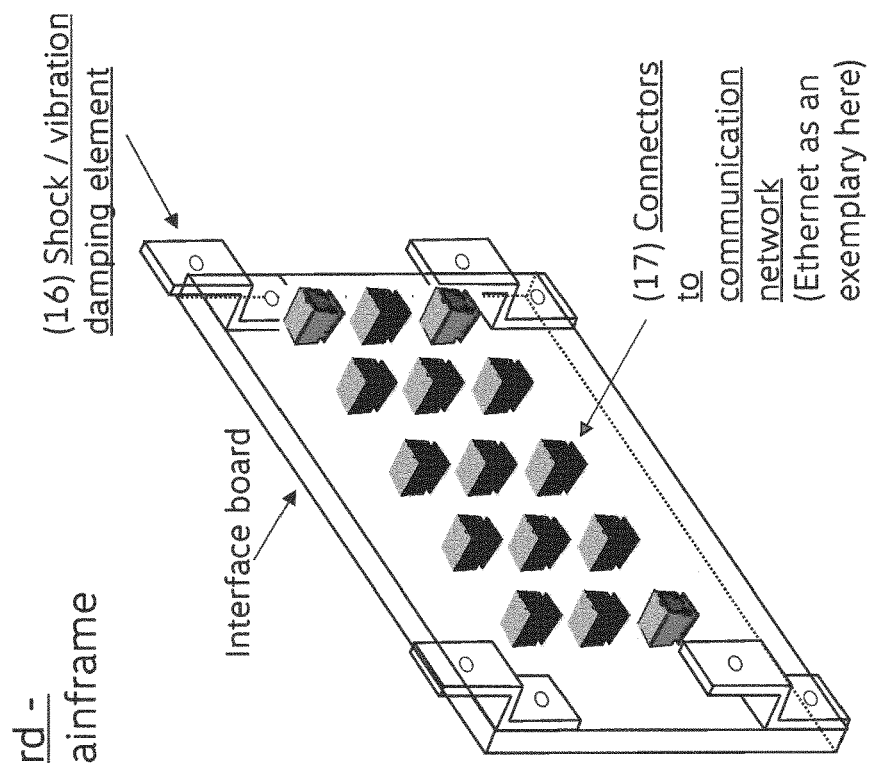
FIGS. 6a and 6b illustrate a main interface board under some aspects of the present disclosure.
Figure 6A:
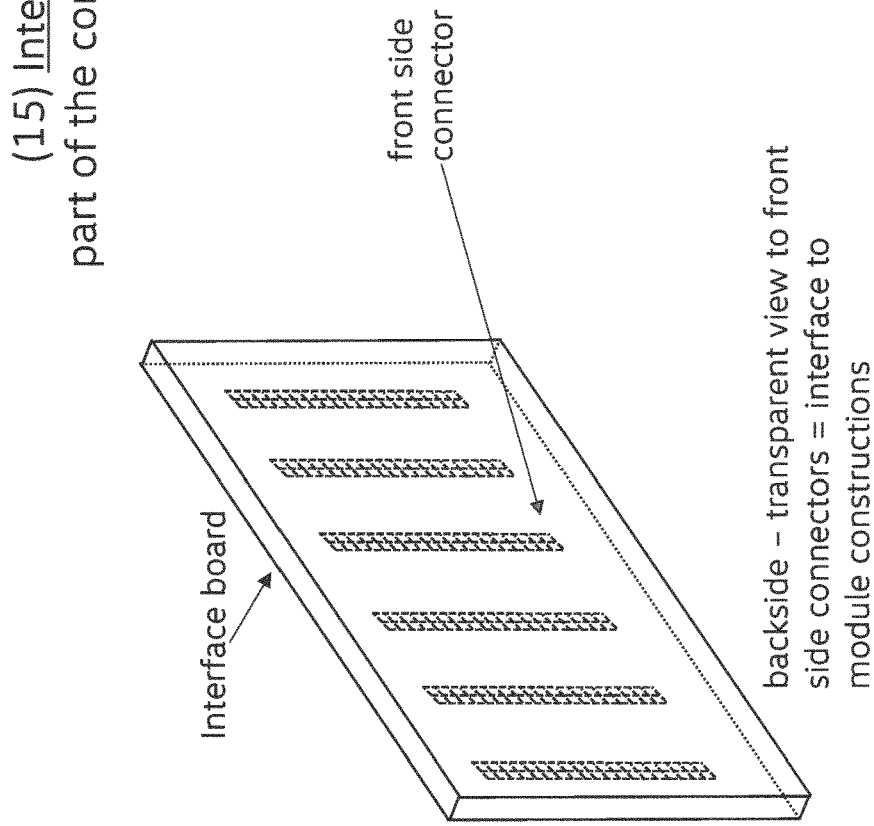

FIGS. 6a and 6b illustrate a main interface board under some aspects of the present disclosure. FIG. 6a shows a front side connector (transparent view to front side connectors, which form an interface to module constructions) and FIG. 6b shows a backside view with damping elements 16 towards the mainframe construction. FIG. 6b further shows connectors 17 to a communication network (e.g., Ethernet, PCIe (Peripheral Component Interconnect Express)).

FIG. 7 depicts electronic modules connected to a main frame interface under some aspects of the present disclosure. FIG. 7 shows an exemplary configuration of three modules 18, 19, 20, each enclosed between cooling blades connected to the mainframe interface board 15, in a parallel configuration. The three example modules are a power module pocket 18, a main board module pocket 19, and a computing extension module pocket 20. As further illustrated by FIG. 7, an electronic module may have a front side connector 21 to connect to further components. This embodiment shows that the cavity formed by the blades 11 can be configured to allow the electronic module to connect to another component using a front side connector 21 of the electronic module. The front side connector 21 is arranged on an opposite side of the main frame interface of a housing of the electronic module.

Figure 8:
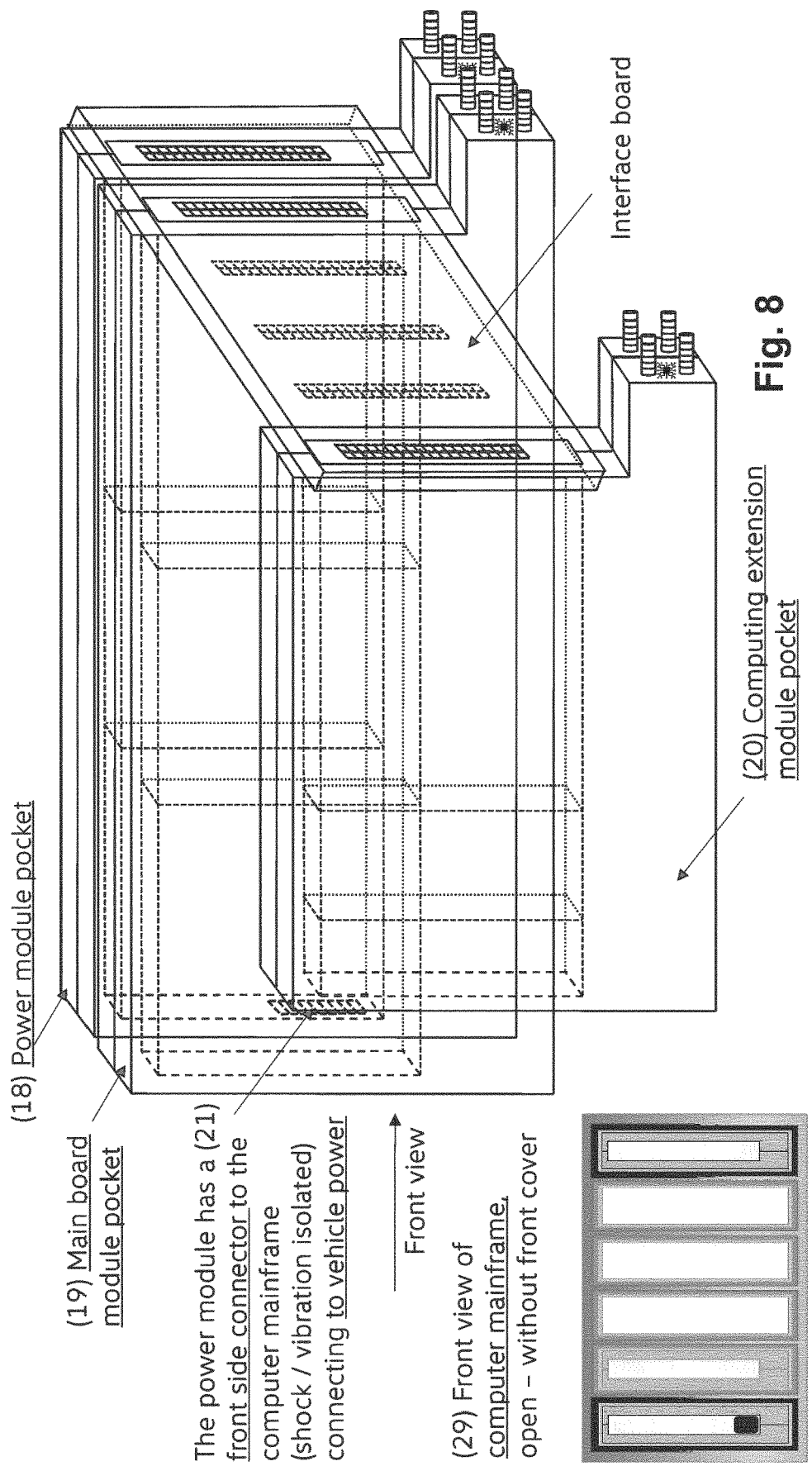
FIG. 8 shows another connection between electronic modules and a main frame interface under some aspects of the present disclosure.

FIG. 8 shows another connection between electronic modules and a main frame interface under some aspects of the present disclosure. In this embodiment, the power module 18 has a front side connector 21 to the computer mainframe (shock and vibration isolated) connecting to vehicle power.

FIGS. 9a and 9b illustrate a configuration of three pocket modules in a main frame under some aspects of the present disclosure. FIGS. 9a, 9b depict a main frame with two or more pocket modules according to the above. FIG. 9a shows a front cover of the computer mainframe with openings or adapters (dependent on the electronic module length within a module pocket) to an electronic module connector. FIG. 9b shows a front cover side view with vibration and shock isolation 27 through elastomeric damping sheets and which could also enclose air bubble based damping elements. Moreover, there is a layer of electrically-conductive silicone elastomers 28 that provide shielding against electromagnetic interference (EMI) and radio frequency interference (RFI).

FIG. 10 depicts a main frame interface in a configuration of three pocket modules in a main frame under some aspects of the present disclosure. FIG. 10 shows a backside cover of the computer mainframe with openings or adapters (dependent on the electronic module length within a module pocket) to electronic module connectors.

Figures 11A, 11B:
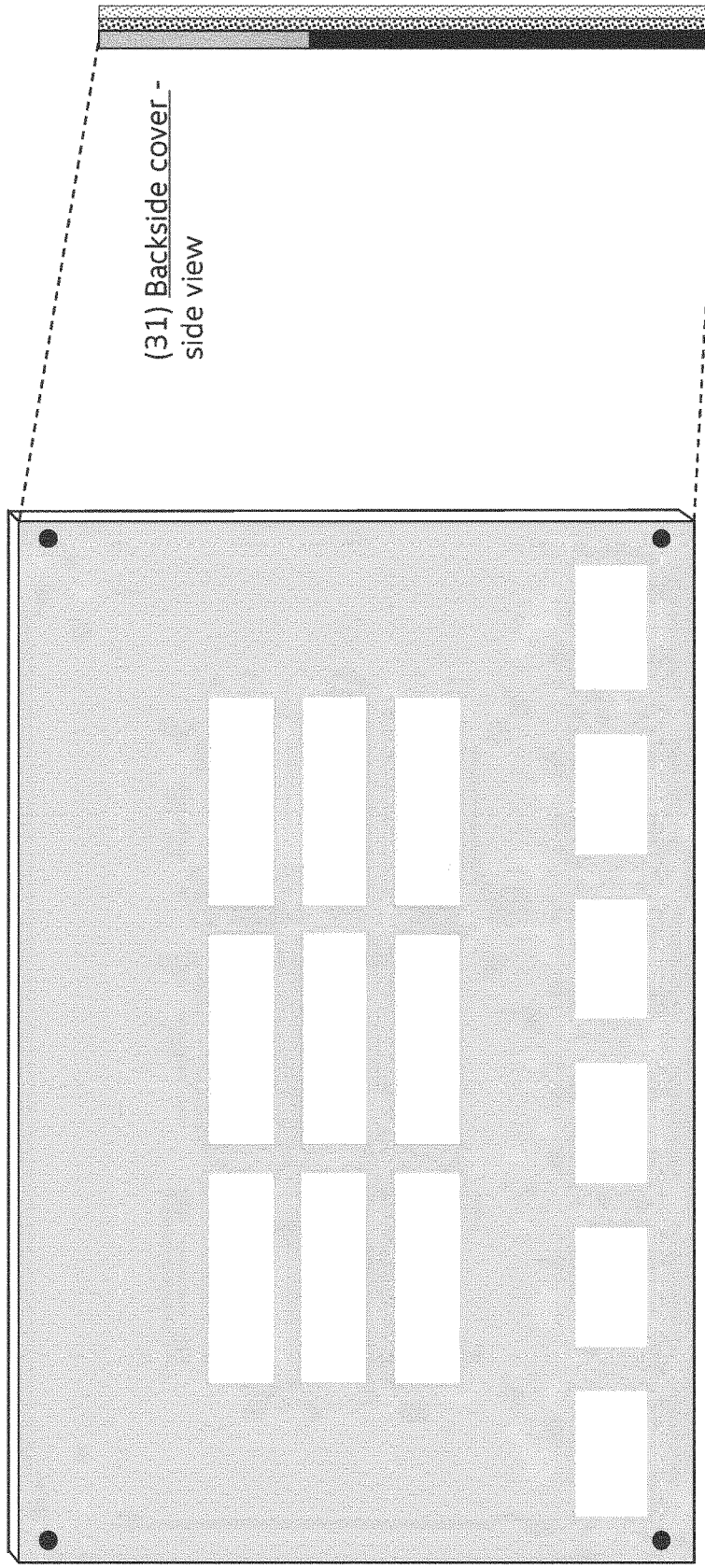
FIGS. 11a and 11b show a backside cover of a mainframe under some aspects of the present disclosure.

FIGS. 11a and 11b show a backside cover of a mainframe under some aspects of the present disclosure. FIG. 11a shows a backside cover lateral view and FIG. 11b shows a backside cover side view with a layer of vibration and shock isolation 27 through elastomeric damping sheets, which could also enclose air bubble based damping elements, and a layer of electrically-conductive silicone elastomers 28 that provide shielding against electromagnetic interference (EMI) and radio frequency interference (RFI). The main frame is configured to shield the pocket module from electro-magnetic radiation.

Figure 12:
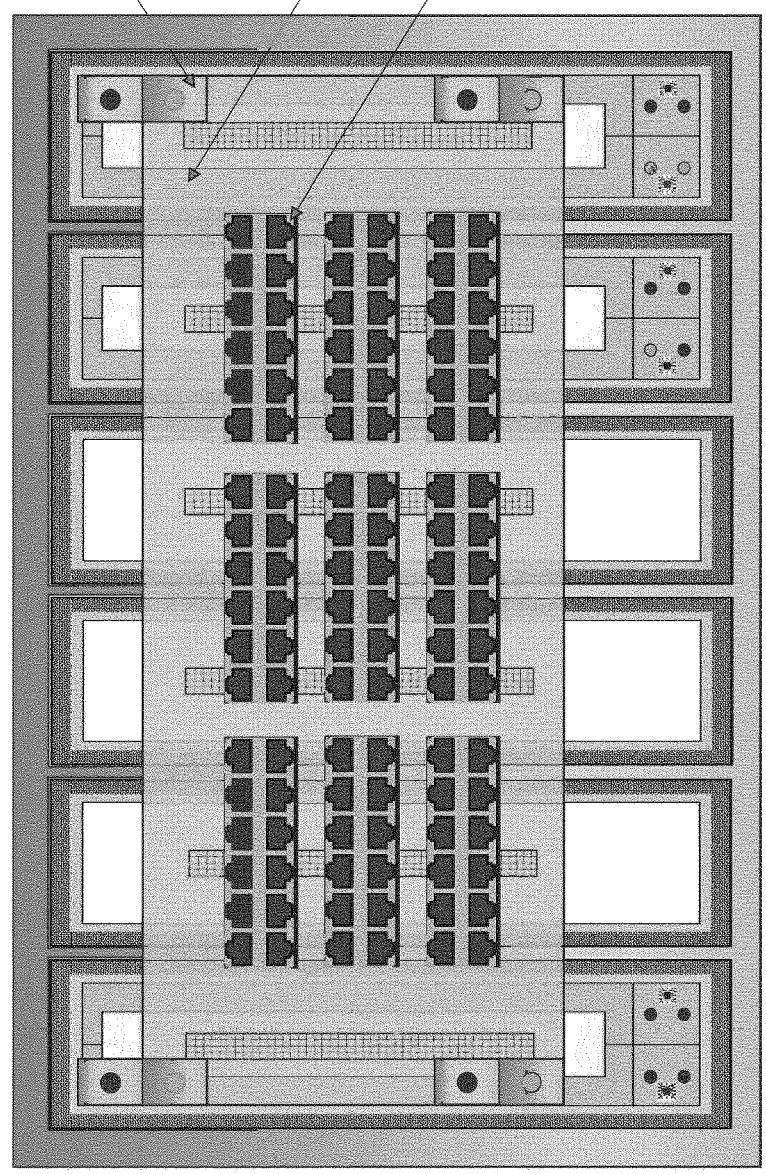
FIG. 12 depicts further details on a backside cover of a mainframe under some aspects of the present disclosure.

FIG. 12 depicts further details on a backside cover of a mainframe under some aspects of the present disclosure. FIG. 12 shows an exemplary configuration of three modules enclosed between cooling blades connected to the mainframe interface board without backside cover and transparent interface board 15. Shock/vibration damping elements are used to mechanically decouple the main frame. The main frame is configured to absorb mechanical stress from the two or more pocket modules. Exemplary ethernet connectors 17 are further shown on the back side.

FIG. 13 illustrates further details on a backside cover of a mainframe under some aspects of the present disclosure. In this Fig. the backside cover 31 of the computer mainframe is transparent. It can be seen how the backside cover 31 covers the backsides of the cooling blades 11 but their cooling connectors.

Figure 14:
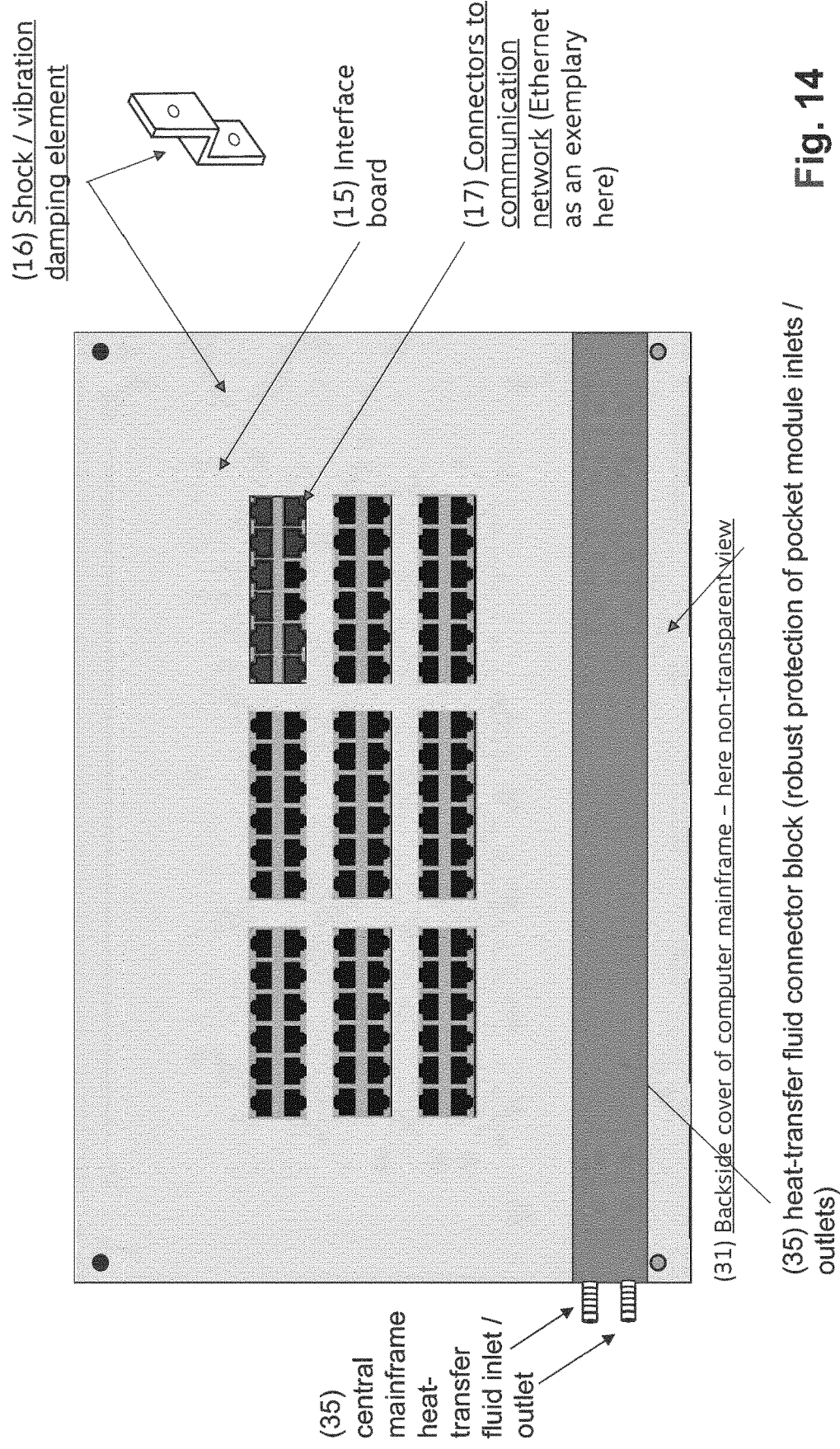
FIG. 14 depicts a heat transfer fluid connector block on a backside of a mainframe under some aspects of the present disclosure.

FIG. 14 depicts a heat transfer fluid connector block on a backside of a mainframe under some aspects of the present disclosure. FIG. 14 shows another exemplary configuration of three modules enclosed between cooling blades connected to the mainframe interface board with a backside cover 31. A heat-transfer fluid connector clock 35 provides robust protection of pocket module inlets/outlets.

Figures 15A, 15B:
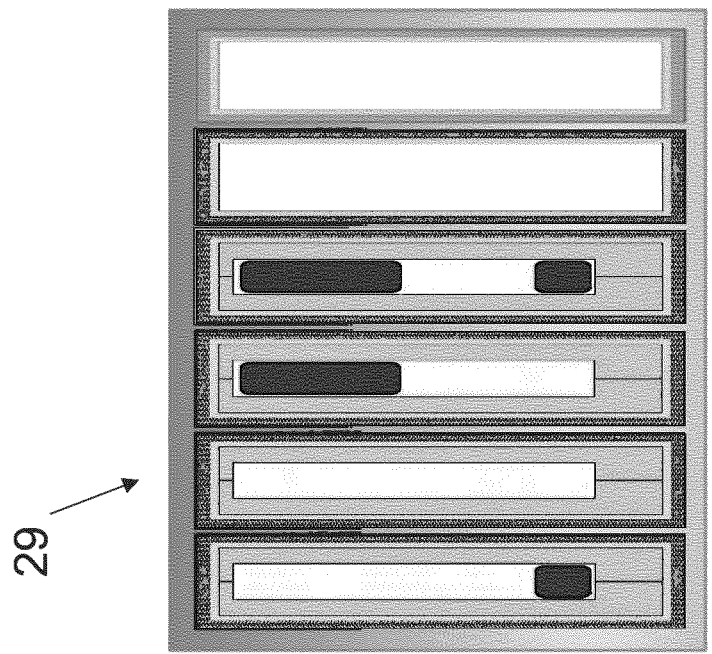
FIGS. 15a and 15b show front view configurations of a main frame under some aspects of the present disclosure.

FIGS. 15a and 15b show front view configurations of a main frame In some examples. As can be seen several front connectors may vary in configurations, for example, with different module combinations as will be detailed below.

Figure 16:
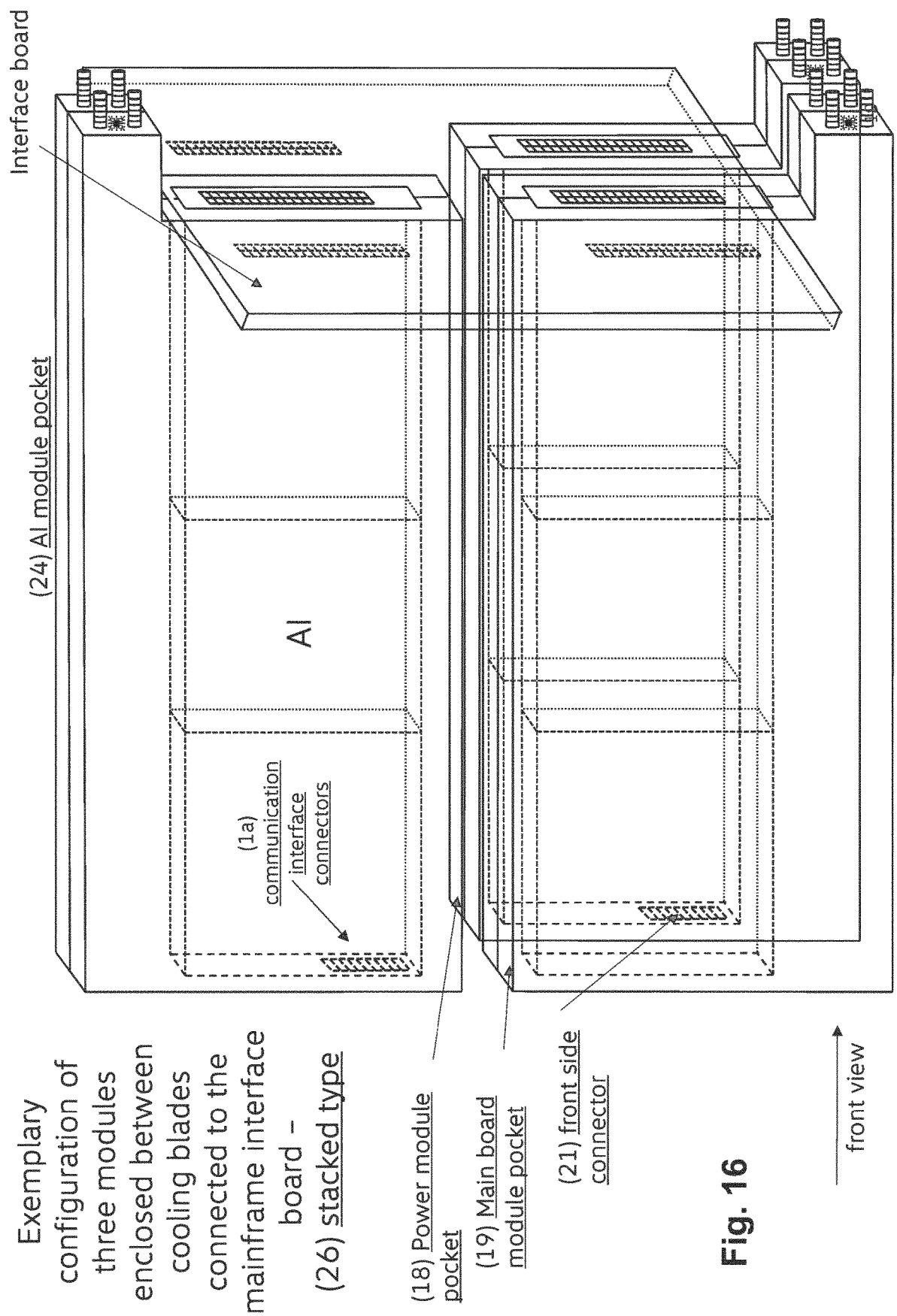
FIG. 16 illustrates an alternative configuration of three pocket modules in a main frame under some aspects of the present disclosure.

FIG. 16 illustrates an alternative configuration of three pocket modules in a main frame under some aspects of the present disclosure. In this example, the electronic modules are stacked 26 as opposed to the parallel configurations 25 shown in the previous Figs. FIG. 16 illustrates that the mainframe may use different geometries in some examples. A main frame 25, 26 with two or more pocket modules 10 as described herein is another embodiment. For example, the main frame 25, 26 is configured to absorb mechanical stress from the two or more pocket modules 10. The main frame 25, 26 can be further configured to shield the pocket module 10 from electro-magnetic radiation.

FIG. 17 depicts further details on the alternative configuration of three pocket modules in a main frame in another embodiment. As shown, different module and therewith front connector configurations are conceivable.

FIG. 18 shows different pocket module configurations under some aspects of the present disclosure. As shown at the top on the left, a power module pocket 18, may be formed by the cooling blades. A power module 21 may have a front side connector 21 to the computer mainframe (shock/vibration isolated) connecting to vehicle power. FIG. 18 further shows a main board module (for an operating system) pocket 19 at the top on the right. Other modules are a general-purpose hardware extension module pocket 20, an onboard connectivity unit (OCU) module pocket 22 with a separate power connector for always on operation or alternatively power domains for low power features, a general-purpose interface extension module pocket 23. Both of which have communication interface connectors 1a, which may provide an easy upgrade option to modern communication interfaces and new sensor types even when the wire harness platform infrastructure is already fixed. FIG. 18 further illustrates an artificial intelligence module pocket 24 at the bottom, which also has communication interface connectors 1a, for example, with an option for fiber optic interfaces (ultra-high bandwidth data communication between sensors and data fusion processing).

FIG. 19 illustrates different pocket module types under some aspects of the present disclosure. A power module pocket 18 is shown at the top. The power module has a front side connector 21 to the computer mainframe (shock/vibration isolated) connecting to vehicle power. A main board module pocket 19 is show at the bottom, which may be used to run an operating system.

FIG. 20 depicts further pocket module types under some aspects of the present disclosure. On the left, a general-purpose hardware extension module pocket 20 is shown. In the middle an OCU module pocket 22 with a front side connector 21 is depicted. A general-purpose interface extension module pocket 23 is shown on the right, which also has a communication interface connector 1a. The latter may provide an easy upgrade option to modern communication interfaces and new sensor types even when wire harness infrastructure is already fixed.

Figure 21:
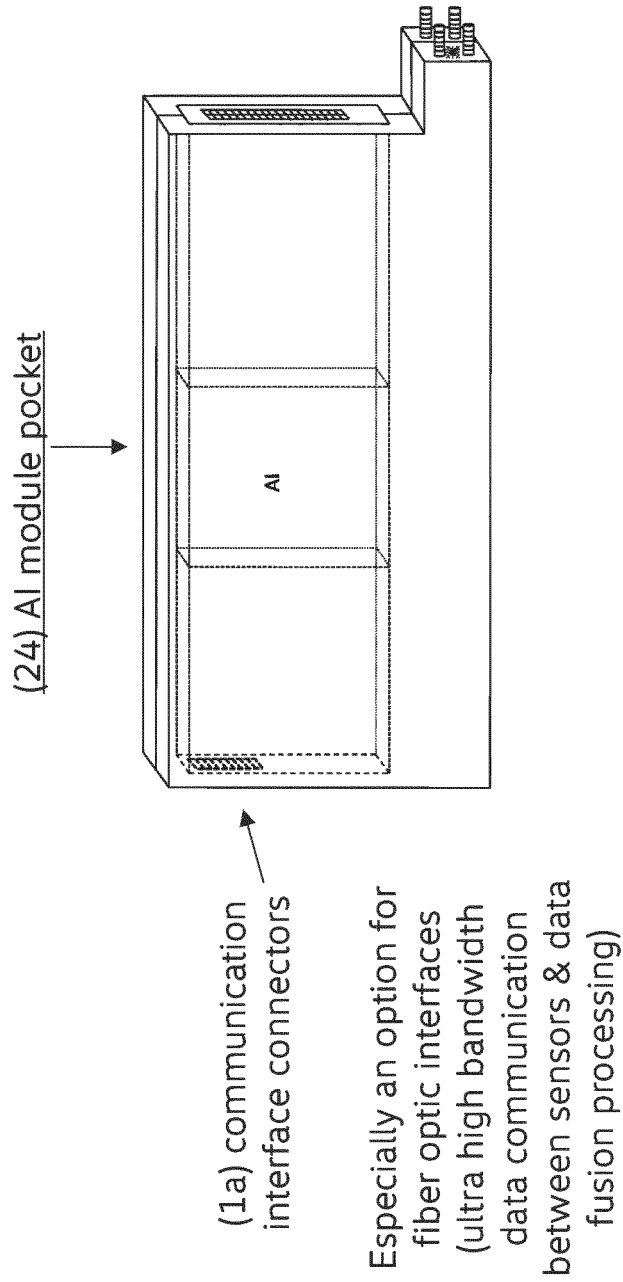
FIG. 21 shows another example of a pocket module under some aspects of the present disclosure.

FIG. 21 shows another embodiment of a pocket module, which is an artificial intelligence (AI) module with a communication interface connector 1a under some aspects of the present disclosure. The communication interface connector 1a may be an option for fiber optic interfaces (ultra-high bandwidth data communication between sensors & data fusion processing).

FIGS. 22a and 22b illustrate integration of a pocket module under some aspects of the present disclosure. FIG. 22a shows a front side view of a module pocket integrated within a mainframe slot 29. Main frame construction features are a simple and cheap construction, an integrated EMI shielding 28, shock/vibration absorbers 27, integrated interface board 15, and central heat-transfer fluid inlet/outlet supplying to the cooling blade 11. FIG. 22b shows a magnification of the vibration and shock isolation using air bubbles.

Figure 23:
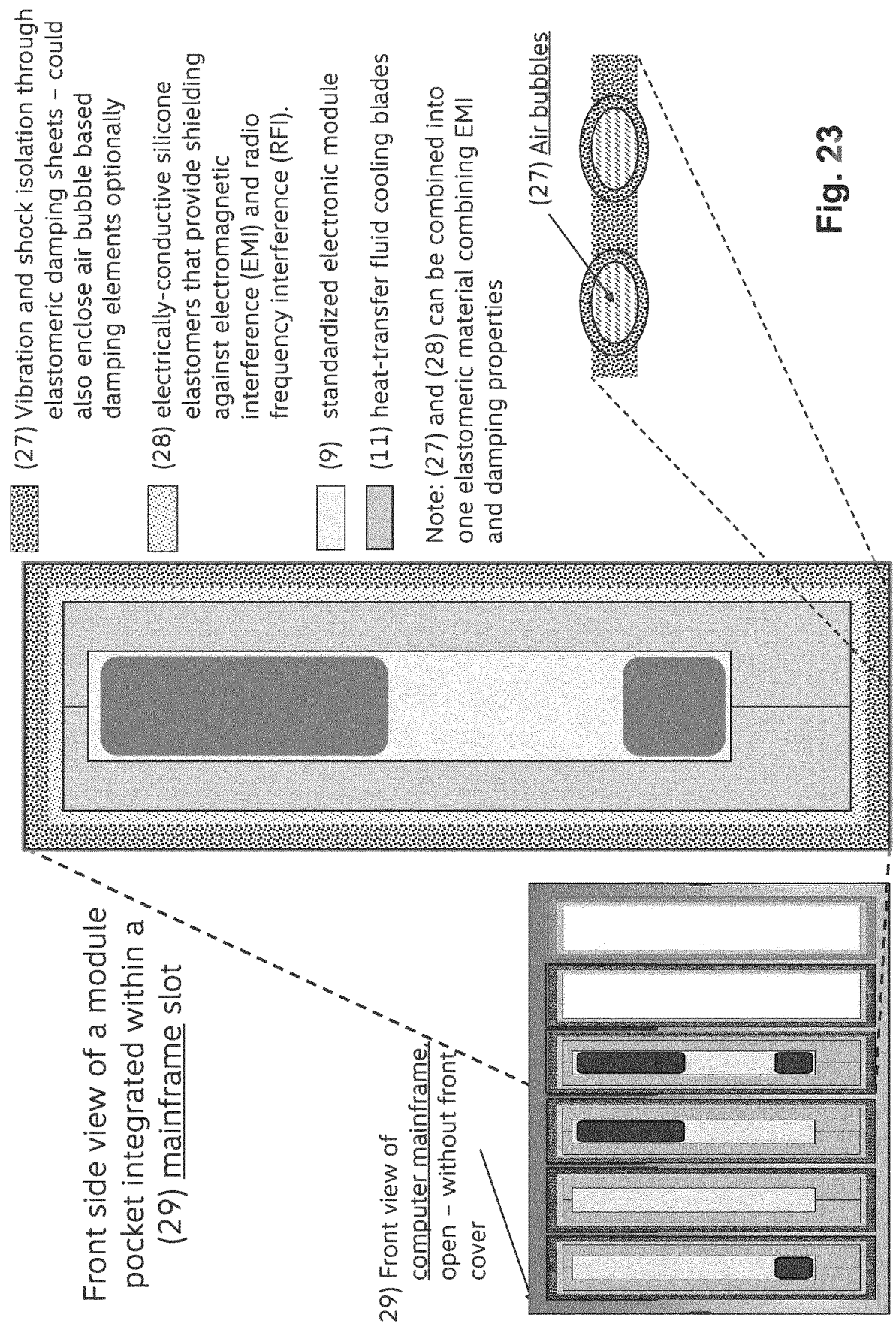
FIG. 23 depicts a front side of an integrated pocket module under some aspects of the present disclosure.

FIG. 23 depicts a front side of an integrated pocket module under some aspects of the present disclosure. FIG. 23 shows a front side view of a module pocket integrated within a mainframe slot 29. On the left the mainframe is shown without front cover and the different front connectors can be seen.

Another example includes a vehicle with a main frame as described herein.

Construction architecture of the Vehicle Central Computer Unit (V-CCU or CCU or mainframe) comprising PCB and electronic module-building elements may be configured as follows:

(5) PCB with special design rules and form-factor range [compare to FIGS. 3 and 4, including (2), (6), (7), (13a)]

(9) standardized electronic module housing family (form-factor range) [compare to FIGS. 1 and 2, including elements (1a), (1b) and (4)]

(10) standardized module pocket family (form-factor range) [compare to FIG. 5, including elements (9), (11), (13b) and (14)]

computer mainframe (29) [compare to FIG. 9-17, including element (10) with its variants (FIG. 19), elements (elements 15, 16, 17 in FIG. 6), (elements 27, 28, 30 in FIG. 9), (elements 27, 28, 31 in FIG. 11) and mainframe slot design including (elements 27, 28 in FIG. 22)

the CCU comprises a (29) computer mainframe with integration slots for (10) module pockets;

the mainframe shape can be customer specific, exemplary variants are (25) the parallel type and (26) the stacked type;

the inner surfaces of the mainframe's slots may be coated with (27) anti-shock/vibration elastomeric damping sheets and (28) electrically-conductive silicone elastomers for EMI (electromagnetic interference) shielding or a combination of (27) and (28);

the mainframe construction may include an (15) interface board that is fixed via (16) damping elements to the mainframe;

the mainframe construction may include a central heat-transfer fluid inlet/outlet that supplies the fluid to (11) heat-transfer fluid cooling blades that are part of (10);

to complete a CCU, at least a (18) power module pocket and a (19) main board module pocket may be integrated into (29); this does not exclude the variant of a mainboard module pocket with a power supply included;

the highest form of covering functional requirements through dedicated HW integration into the CCU may be established by additionally integrating (20) general purpose HW extension module pockets, an (22) OCU Module pocket, an (24) AI module pocket (AI=Artificial Intelligence) and (23) general purpose interface extension module pockets (SAC, ZeCs)

Specific features of those pocket module types are illustrated in the drawings, especially in FIGS. 18 to 21.

Construction of the module pocket (10) may be configured as follows:

Each module pocket that is easily inserted/integrated into the computer mainframe may comprise two fluid cooling blades (11) that may enclose a standardized electronic module housing (9).

Additional construction features like fluid leakage monitor (13b) and module-blade interfacing (14) of the module pocket are illustrated in FIGS. 5a, b.

Construction of the standardized electronic module (9) may be configured as follows:

Construction features (1c) comprising a scalable metal housing (8), automotive compliant connector (4) to the mainframe interface board (15), optional front side interface connectors (1a), optional front side power connector (1b) of the electronic module are illustrated in FIG. 1.

Design principle of the PCB/PCBA (5) within (9) may be configured as follows:

Construction features [(2) spacer dice, (6) thermal interface material, (7) grounded thermal distribution layer, (13a) mechanical deformation monitor and geometric arrangement of such features] of the (5) assembled PCB (printed circuit board) are illustrated in FIGS. 3 and 4. Mechanical deformation may be monitored by integrated sensors.

Further configurations include:

The design of the (5) assembled PCB has predefined features in accordance the present disclosure that add to the individual design of an electronic module and enable the usage of sensitive leading-edge components (conformal heat distribution—avoidance of harsh heat cycles, improved grounding and EMI shielding, mechanical stability and decoupling of (thermo-)mechanical forces from housing to electronic components). For example, a construction forced conformal heat distribution reduces thermally induced mechanical stress gradients as cause for cracks, delamination etc.

The electronic module and pocket design principle allows maximum sizing flexibility with standardized module sizes.

The separation of cooling blades, electronic modules plus standardized module shapes allow to purchase from different vendors by keeping the compatibility the connection between electronic modules may be established via the interface board, and this simplifies scalability as the power supply can be exchanged dependent on the actual power needed (redundant power source addition possible)—thus cost optimization is an advantage.

The anti-shock/vibration construction plus optimized cooling and EMI shielding enable unique operation features (sensitive leading-edge semiconductors, optical fiber interfacing etc.) to be integrated into electronic modules.

A vehicle may be understood as a device for transporting persons and/or goods, such as passenger vehicles, trucks, busses, trains, ships, drones, aircrafts, space crafts and the like. The present disclosure is preferably installed in a vehicle of the automotive industry, especially to a car, a bus or a truck, but not limited to these applications.

A Vehicle Central Compute Unit (Vehicle CCU) may be understood as a device used for computing data and/or information regarding a vehicle. The Vehicle CCU may be installed on-board of the vehicle. Parts of the Vehicle CCU may be located or at least be interactive with a compute device off-board, such as a cloud computing system or a computing entity. Moreover, the Vehicle CCU may be portable and exchangeable. Thus, the Vehicle CCU or its pocket modules may be replaced in the vehicle during maintenance of the computing system.

The present disclosure provides a solution for a centralized compute unit. The suggested construction and integration of such a unit may replace a plurality of single control units in a vehicle. The solution may be implemented in high integrated electronic systems, especially which may be related to security sensitive applications. Especially the provided solution may be applicable for applications of high life-span products which may have a high environmental impact. These applications may be found in automotive industry, in aircraft and space industry as well as ship and train vehicles.

Moreover, the present disclosure and exemplary embodiments thereof relate to the construction architecture of a Vehicle Central Compute Unit (V-CCU) that provides implementation solutions to challenges around complexity management, scalability, upgradeability, easy exchangeability, optimized power and thermal management, EMI issue avoidance/reduction and especially safety/reliability enablement for current and future leading-edge electronics.

While above several exemplary embodiments of the present disclosure has been described, it has to be noted that a great number of variations thereto exists. Furthermore, it is appreciated that the described exemplary embodiments only illustrate non-limiting examples of how the present disclosure can be implemented and that it is not intended to limit the scope, the application or the configuration of the herein-described apparatuses and methods. Rather, the preceding description will provide the person skilled in the art with constructions for implementing at least one exemplary embodiment of the present disclosure, wherein it has to be understood that various changes of functionality and the arrangement of the elements of the exemplary embodiment can be made, without deviating from the subject-matter defined by the appended claims and their legal equivalents.

The following provides an overview of aspects of the present disclosure:

Aspect 1 is a printed circuit board (5) comprising electronic components (3), a thermal distribution layer (7) and at least one spacer element (2), wherein the thermal distribution layer (7) is integrated inside the printed circuit board (5), and wherein the at least one spacer element (2) is connected to the printed circuit board (5) on its outer side.

Aspect 2 may be combined with aspect 1 and includes that the thermal distribution layer (7) is a plane layer within the thermal distribution layer (7).

Aspect 3 may be combined with any of aspects 1 and/or 2 and includes at least one embedded temperature and mechanical deformation sensor (13a).

Aspect 4 may be combined with any of aspects 1 through 3 and includes that the printed circuit board (5) is connected with the spacer element (2) via a connection, wherein the connection is a thermal connection as well as an electrical connection.

Aspect 5 is an electronic module (9) comprising a housing (8), a printed circuit board (5), and at least one spacer element (2) between the housing (2) and the printed circuit board (5).

Aspect 6 may be combined with aspect 6 and includes that the electronic module (9) is a printed circuit board (5) according to any of aspects 1 through 4.

Aspect 7 may be combined with any of aspects 5 and/or 6, and includes a power interface.

Aspect 8 may be combined with any of aspects 5 through 7, and includes a communication interface.

Aspect 9 may be combined with any of aspects 5 through 8, and includes that, in operation, the electronic module (9) has at least one heat source (3) and at least one heat sink (2), (7), (8), (11), wherein inside the housing of the electronic module (9) a thermal distribution layer (7) of a printed circuit board (5) is installed for distributing the thermal energy of the heat source to the heat sink.

Aspect 10 is a pocket module (10) comprising at least one electronic module according to any of aspects 5-8, and includes a module housing, a module connector, and at least one fluid interface.

Aspect 11 may be combined with aspect 10 and includes a first heat transfer cooling blade (14) and a second heat transfer cooling blade (14).

Aspect 12 may be combined with any of aspects 10 and/or 11 and includes a humidity sensor (13b).

Aspect 13 may be combined with any of aspects 10 through 11 and includes internal space for installation of one or more electronic modules (9) of different sizes.

Aspect 14 may be combined with any of aspects 10 through 13 and includes a thermal interface between the module housing and the cooling blades (14), preferably a adhesion fluid (oil) or magnetic layer coating.

Aspect 15 may be combined with any of aspects 10 through 14 and includes a step-shaped geometry, preferably provided in the lower part of the pocket module (10).

Aspect 16 is a central compute unit, such as a vehicle central compute unit, comprising a mainframe with integrated slots for a plurality of pocket modules (10) according to any of aspects 10-15.

Aspect 17 may be combined with aspect 16 and includes an interface board (15), which has preferably damping elements for damping mechanical vibrations.

Aspect 18 may be combined with any of aspects 16 and/or 17 and includes a power module (18).

Aspect 19 may be combined with any of aspects 16 through 18 and includes at least one module out of the group of modules: a main board module, a central HW extension module, an OCU module, an AI module, an interface, in particular an interface module ZeC or in particular an interface as an interface extension module SAC, a communication module and a wireless communication module.

Aspect 20 may be combined with any of aspects 16 through 19 and includes one or a plurality of vibration damping elements (16).

Aspect 21 may be combined with any of aspects 16 through 20 and includes one or a plurality of thermal guiding elements. The thermal guiding elements may define the heat transfer flow.

Aspect 22 may be combined with any of aspects 16 through 21 and includes one or a plurality of temperature and/or deformation sensors.

Aspect 23 may be combined with any of aspects 16 through 22 and includes at least one electromagnetic shielding element.

Aspect 24 may be combined with any of aspects 16 through 23 and includes a front cover.

Aspect 25 may be combined with any of aspects 16 through 24 and includes a back cover.

Aspect 26 is a manufacturing method for manufacturing a printed circuit board (5) according to aspects 1-4, comprising providing elements of the printed circuit board (5) and assembling the elements.

Aspect 27 is a manufacturing method for manufacturing a electronic module (9) according to aspects 5-9, comprising providing elements of the electronic module (9) and assembling the elements.

Aspect 28 is a manufacturing method for manufacturing a pocket module (10) according to any of the proceeding items, comprising providing elements of the pocket module (10) and assembling the elements.

Aspect 29 is a manufacturing method for manufacturing a central compute unit according to aspects 16-25, and includes providing elements of the central compute unit and assembling the elements.

Aspect 30 is a vehicle comprising a central compute unit according to any of aspects 16 to 25, preferably the central compute unit is installed within the vehicle.

Aspect 31 may be combined with aspect 30 and includes that the vehicle is a car, a bus or a truck.

REFERENCE LIST (1a) communication interface connectors
(1b) power connector (1c) variable module size
(2) spacer element, for example spacer dice, spacer element preferably grounded
(3) electronic component, for example a semiconductor
(4) module connector towards the interface board of the computer mainframe
(5) printed circuit board/PCB/PCBA
(6) TIM (thermal interface material) utilized as thermal guiding element
(7) TDL (thermal distribution layer), preferably electrically grounded, utilized as thermal guiding element
(8) module housing, preferably made of metal
(9) electronic module, preferably a standardized electronic module
(10) module pocket
(11) cooling blade
(12) fluid interface (inlet and/or outlet) for cooling by fluid, see for example FIG. 5a
(13a) embedded sensor, suitable for energy harvesting device, mechanic deformation and/or temperature
(13b) humidity sensor for detecting humidity (humidity detector)
(14) adhesion fluid (oil) or magnetic layer coating
(15) interface board
(16) shock/vibration damping element
(17) connector to communication network
(18) power module pocket
(19) main board module pocket
(20) general purpose HW extension module pocket
(21) front side connector to the computer mainframe
(22) on-board connectivity module pocket
(23) general purpose interface extension module pocket, for example named SAC or ZeC
(24) AI module pocket
(25) parallel type version of computer mainframe (29)
(26) stacked type version of computer mainframe (29)
(27) mechanical damping element, for example elastomer material, purpose of vibration and shock isolation through for example elastomeric damping sheets—optionally mechanical damping element could enclose air bubble structure
(28) electrical shielding element, for example electrically-conductive silicone elastomers that provide shielding against electromagnetic interference (EMI) and radio frequency interference (RFI)
(29) computer mainframe
(30) front cover of computer mainframe
(31) backside cover of computer mainframe
(32) heat transfer flow, see for example FIG. 3c
(33) heat transfer via radiation, see for example FIG. 3c
(34) heat transfer via conduction, see for example FIG. 3c
(35) heat-transfer fluid inlet/outlet at central mainframe, heat-transfer fluid connector block (robust protection of pocket module inlets/outlets)

The invention claimed is:

1. A printed circuit board for an electronic vehicular component, the printed circuit board comprising:
a thermal distribution layer embedded in the printed circuit board;
one or more thermal coupling areas on a surface of the printed circuit board, the one or more thermal coupling areas comprising one or more spacer dice disposed on the surface of the printed circuit board and configured to thermally couple the thermal distribution layer to a housing surrounding the printed circuit board and to mechanically stabilize the printed circuit board within the housing;
wherein the one or more thermal coupling areas are configured for heat dissipation away from the printed circuit board through the housing, and wherein the one or more thermal coupling areas are thermally coupled to the thermal distribution layer in the printed circuit board.

2. The printed circuit board according to claim 1, further comprising one or more contacts for grounding the thermal distribution layer.

3. The printed circuit board according to claim 1, wherein the thermal coupling areas are electrically coupled to the thermal distribution layer.

4. The printed circuit board according to claim 1, further comprising one or more sensors embedded in the printed circuit board.

5. The printed circuit board according to claim 4, wherein the one or more sensors comprise at least one of a temperature sensor, a temperature sensor with energy harvesting device, a mechanical deformation sensor, and a mechanical deformation sensor with energy harvesting device.

6. The printed circuit board according to claim 4, wherein the one or more sensors comprise at least one combined mechanical deformation and temperature sensor.

7. The printed circuit board according to claim 1, further comprising a grid of distributed sensors.

8. An electronic module for a vehicle comprising:
a printed circuit board, comprising
a thermal distribution layer embedded in the printed circuit board;
one or more thermal coupling areas on a surface of the printed circuit board, the one or more thermal coupling areas comprising one or more spacer dice disposed on the surface of the printed circuit board and configured to thermally couple the thermal distribution layer to a housing surrounding the printed circuit board and to mechanically stabilize the printed circuit board within the housing,
wherein the one or more thermal coupling areas are configured for heat dissipation away from the printed circuit board through the housing and wherein the one or more thermal coupling areas are thermally coupled to the thermal distribution layer in the printed circuit board.

9. The electronic module according to claim 8, further comprising
electronic components, mounted on the printed circuit board;
a housing for the printed circuit board with the electronic components; and
thermal interface material, configured to thermally couple the electronic components and the housing.

10. The electronic module according to claim 9, wherein the housing is configured to shield the printed circuit board from electromagnetic radiation.

11. The electronic module according to claim 8, further comprising one or more sensors embedded in the printed circuit board.

12. The electronic module according to claim 11, further comprising thermal interface material configured to thermally couple at least one of the one or more spacer dice to the housing.

13. The electronic module according to claim 11, wherein the spacer dice are configured to be grounded together with the housing.

14. The electronic module according to claim 11, wherein the one or more spacer dice are further configured to mechanically stabilize the printed circuit board in the housing.

15. The electronic module according to claim 8, further comprising a module connector, configured to provide an electrical coupling to the printed circuit board from the outside of the electronic module.

16. An electronic apparatus for a vehicle comprising:
a pocket module comprising two cooling blades; and
a printed circuit board coupled to the pocket module, the printed circuit board comprising
  a thermal distribution layer embedded in the printed circuit board;
  one or more thermal coupling areas on a surface of the printed circuit board, the one or more thermal coupling areas comprising one or more spacer dice disposed on the surface of the printed circuit board and configured to thermally couple the thermal distribution layer to a housing surrounding the printed circuit board and to mechanically stabilize the printed circuit board within the housing,
  wherein the one or more thermal coupling areas are configured for heat dissipation away from the printed circuit board through the housing, and wherein the one or more thermal coupling areas are thermally coupled to the thermal distribution layer in the printed circuit board.

17. The electronic apparatus according to claim 16, further comprising
electronic components, mounted on the printed circuit board;
a housing for the printed circuit board with the electronic components; and
thermal interface material, configured to thermally couple the electronic components and the housing.

18. The electronic apparatus according to claim 16, further comprising one or more sensors embedded in the printed circuit board.

19. The electronic apparatus according to claim 18, further comprising thermal interface material configured to thermally couple at least one of the one or more spacer dice to the housing.

20. The electronic apparatus according to claim 18, wherein the spacer dice are configured to be grounded together with the housing.

* * * * *